United States Patent
LaMotte

(10) Patent No.: US 7,185,861 B2
(45) Date of Patent: Mar. 6, 2007

(54) COLLAPSIBLE DISPLAY SYSTEM

(75) Inventor: Lester A. LaMotte, Burnsville, MN (US)

(73) Assignee: Xtra Lite Display Systems, Inc., Burnsville, MN (US)

( * ) Notice: Subject to any disclaimer, the term of this patent is extended or adjusted under 35 U.S.C. 154(b) by 700 days.

(21) Appl. No.: 09/767,442

(22) Filed: Jan. 23, 2001

(65) Prior Publication Data

US 2001/0015399 A1    Aug. 23, 2001

Related U.S. Application Data

(63) Continuation-in-part of application No. 09/480,108, filed on Jan. 10, 2000, now abandoned, which is a continuation-in-part of application No. 08/878,745, filed on Jun. 19, 1997, now Pat. No. 6,012,688, which is a continuation-in-part of application No. 08/738,876, filed on Oct. 28, 1996, now Pat. No. 5,839,705.

(51) Int. Cl.
F16M 11/24    (2006.01)

(52) U.S. Cl. ............... 248/165; 248/163.2; 40/603; 160/135

(58) Field of Classification Search ............. 248/165, 248/163.2, 431, 175, 176.1, 156, 164; 211/189, 211/182; 160/135, 368.1, 351; 40/603, 40/604, 610, 749
See application file for complete search history.

(56) References Cited

U.S. PATENT DOCUMENTS

| | | | | |
|---|---|---|---|---|
| 1,873,178 A | * | 8/1932 | Bernstein | ............... 40/603 |
| 3,810,482 A | * | 5/1974 | Beavers | ............... 135/147 |
| 4,017,152 A | | 4/1977 | Allen | |
| 4,522,008 A | * | 6/1985 | Zeigler | ............... 52/646 |
| 4,580,375 A | | 4/1986 | Nodskov et al. | |
| 4,627,210 A | * | 12/1986 | Beaulieu | ............... 52/646 |
| 4,692,050 A | | 9/1987 | Kaufman | |
| 4,694,601 A | | 9/1987 | Dicke et al. | |
| 4,700,498 A | | 10/1987 | Perutz et al. | |
| 4,800,663 A | | 1/1989 | Zeigler | |
| 4,809,471 A | * | 3/1989 | Wichman et al. | ............... 52/109 |
| 4,875,302 A | | 10/1989 | Noffsinger | |
| 4,888,895 A | * | 12/1989 | Kemeny | ............... 40/610 |
| 4,923,155 A | | 5/1990 | Dainis et al. | |
| 4,934,638 A | | 6/1990 | Davis | |
| 4,942,686 A | * | 7/1990 | Kemeny | ............... 40/610 |
| 4,970,841 A | | 11/1990 | Zeigler | |
| 5,044,507 A | | 9/1991 | Shulyak | |
| 5,090,143 A | * | 2/1992 | Schier et al. | ............... 40/790 |
| 5,123,550 A | | 6/1992 | Nodskov et al. | |
| 5,203,126 A | | 4/1993 | Sorenson et al. | |
| 5,230,196 A | | 7/1993 | Zeigler | |
| 5,269,112 A | | 12/1993 | Weinrub et al. | |
| 5,351,843 A | | 10/1994 | Wichman et al. | |
| 5,362,020 A | | 11/1994 | Brown | |
| 5,388,359 A | | 2/1995 | DeWitt | |
| 5,444,946 A | | 8/1995 | Zeigler | |

(Continued)

Primary Examiner—Kimberly T. Wood
(74) Attorney, Agent, or Firm—Nikolai & Mersereau, P.A.; C. G. Mersereau

(57) ABSTRACT

The disclosure relates to any improved display system unit for holding display panels, photomurals, banners, signs or the like in a variety of sizes. There is also depicted multi-unit systems consecutively joined by hinged and straight connectors to form any desired display configuration. Interchangeable snap or press fit connectors allow alternate assemblies and wall or floor mounting.

21 Claims, 39 Drawing Sheets

U.S. PATENT DOCUMENTS 5,560,502 A    10/1996 Hsiung
5,722,477 A *  3/1998 Richter et al. .............. 160/135
5,826,397 A * 10/1998 Armold ....................... 52/646
5,839,705 A * 11/1998 Lamotte ..................... 248/165
6,012,688 A *  1/2000 LaMotte ..................... 248/165

* cited by examiner

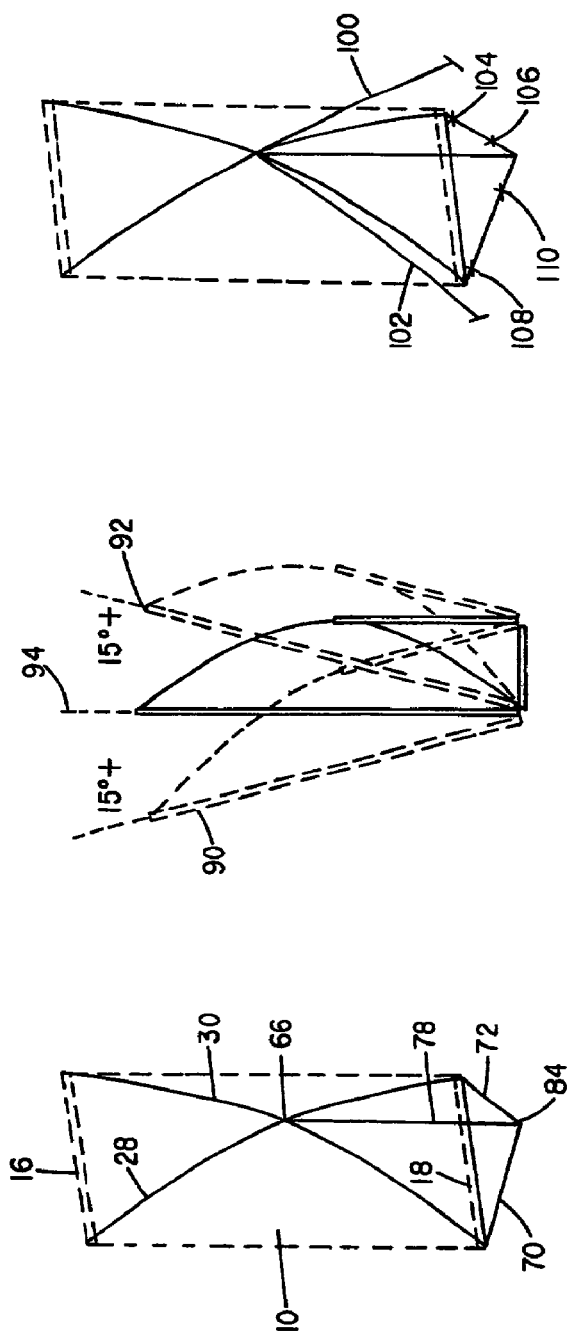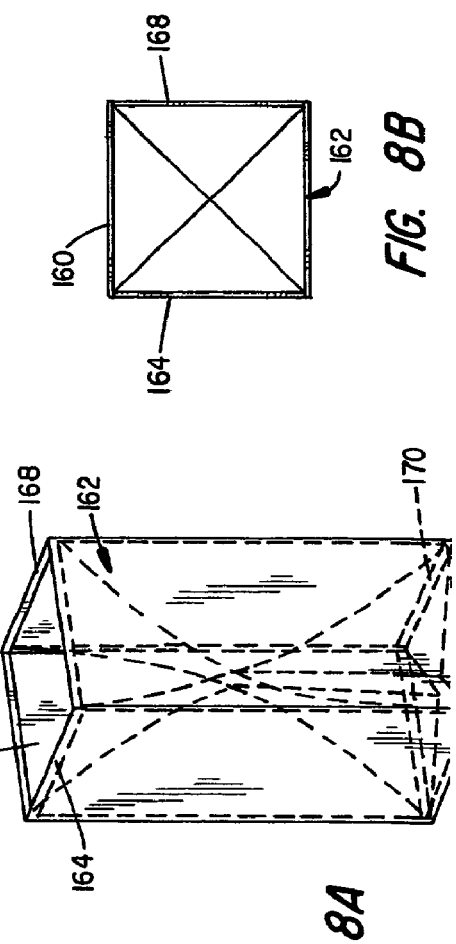

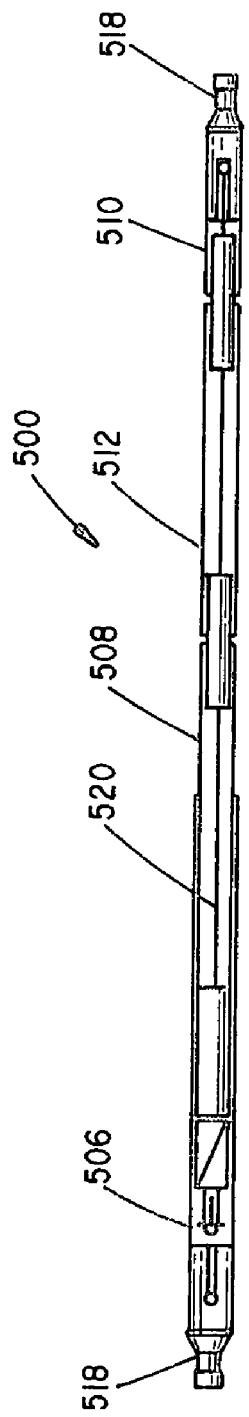
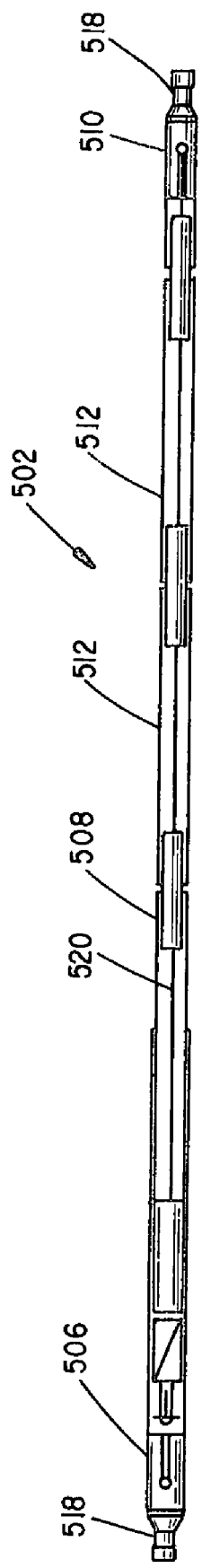
FIG. 28A
FIG. 28B

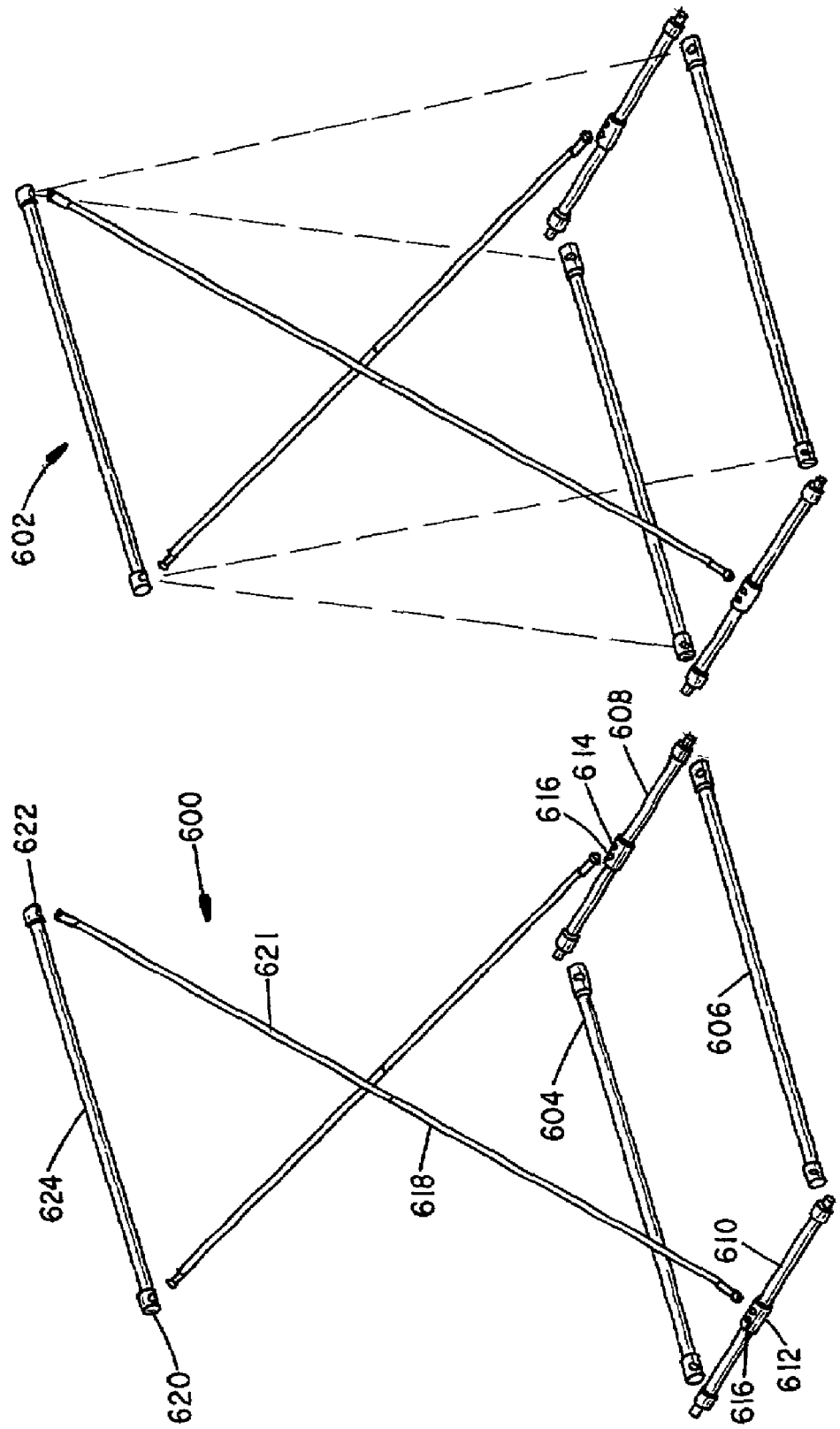

COLLAPSIBLE DISPLAY SYSTEM

This application is a continuation-in-part of application Ser. No. 09/480,108, filed Jan. 10, 2000 now abandoned, itself a continuation-in-part of application Ser. No. 08/878,745, filed Jun. 19, 1997 now U.S. Pat. No. 6,012,688 which, in turn, is a continuation-in-part of application Ser. No. 08/738,876, filed Oct. 28, 1996, now U.S. Pat. No. 5,839,705, issued Nov. 24, 1998. The previous related applications are of common inventorship and assignment and the contents of both are deemed incorporated by reference herein in their entirety for any purpose.

BACKGROUND OF THE INVENTION

I. Field of the Invention

The present invention relates to improved display systems for holding display graphics including panels, photomurals, banners, signs or the like in tension and in a generally upright, but angularly adjustable, position and particularly to a collapsible lightweight system that is easily assembled with the item to be displayed or collapsed for transport or storage. The display system can be used indoors as a stand alone support or outdoors with a stake-down system or stabilizing counter weights.

II. Related Art

There often exists a need to provide a temporary or portable device for displaying a photomural or other information carrying banner or sign that is readily deployed to support and display a relatively large sign and yet can be collapsed into a lightweight, easily carried compact form for transport and storage. Such a device would find advantageous use in retail sales displays, trade shows, fairs, lawn signs or the like to provide a variety of information to those in view of it. Certain types of signs have been devised that are portable and at least to some extent collapsible.

One type of collapsible, multi-faceted, self-supporting systems with opposed displays is shown by Zeigler (U.S. Pat. No. 4,970,841) in which panels are held together in a back-to-back arrangement. Other collapsible systems are depicted in U.S. Pat. No. 4,700,498 to Perutz et al and U.S. Pat. No. 5,203,126 to Sorenson et al. Scissor connectors are used to interconnect a plurality of vertical frame units in Weinrub et al (U.S. Pat. No. 5,269,112).

While existing devices have certain attributes and provide a degree of flexibility and portability in display signs, there remains a need for a lightweight, durable, fully collapsible system that deploys from a knock-down transport or storage state to accommodate a variety of banners or photo-murals readily. There also exists a need for such a system in which a plurality of different banners or murals can be interchangeably displayed in a variety of combinations of multiple panels using the same frames to form a variety of larger multiple-frame displays of various configurations. There also would be an advantage if the size of the display frame could be varied to accommodate a variety of display sizes.

Accordingly, it is a primary object of the present invention to provide a versatile, lightweight, durable, readily deployed, readily collapsible display support system for a banner or photomural display panel that combines in a variety of configurations to accommodate a variety of banners.

A further object of the invention is to provide a lightweight, durable, readily deployed, readily collapsible display support system for a plurality of banner or photomural display panel units in which a variety of banners or photomurals can readily be accommodated on panels joined together in a manner that enables at least some individual panels to be pivoted relative to each other to form triangles, winged shapes and any number of other display shapes.

Another object of the present invention is to provide such a multi-panel display support system in which the posture of any display panel is variable and easily adjusted.

Still another object of the present invention is the provision of a collapsible self-supporting display panel unit of adjustable size.

Yet another object of the present invention is to provide such a display panel support system that is relatively rugged and economical.

A still further object of the invention is to provide a lightweight, durable, readily deployed, readily collapsible display support system for a plurality of banner or photomural display panels in which the banners or photomurals can be displayed in one or more directions.

A yet still further object of the invention is to provide a lightweight, durable, readily deployed, readily collapsible display support system for a plurality of banner or photomural display panels in which the banners or photomurals can be displayed a single direction consecutively in line.

Other objects and advantages associated with the display panel support system of the invention will become apparent to those skilled in the art upon further consideration of this specification, drawings and appended claims.

SUMMARY OF THE INVENTION

The present invention provides compact, lightweight, self-contained support systems that are easily deployed to carry and support one or more photomurals, banners, signs or the like under tension and that readily collapse to rather small sizes for transport and storage. As used herein, the terms "banner" or panel or photomural, etc. are defined to include all possible types of display articles susceptible of mounting using the support system of the invention.

The display support systems of the invention may take a variety of forms using relatively few interchangeable parts making them extremely versatile and easy to manufacture. The system may be constructed of segments of strong, light weight aluminum alloy tube connected using slip fittings, connecting hub devices and other unique parts. Other materials including other metals and polymeric materials or fiberglass may also be used for the rod segments. Connectors and hub devices may be machined from metals or made of any dimensionally stable material including cast, molded or otherwise processed polymer materials such as polyamides, for example. Successful parts here been made from various nylons.

In some cases, portions of the rods or other parts may be of solid construction. The parts may be snap-fit together using a variety of fittings. However, the panel support systems or individual units are generally made up of a plurality of hollow tube segments connected by one or more internal resilient cord (bungee) systems that allow easy assembly and disassembly (knock down) for transport or storage in a relatively small container. The support units can be sized to carry one or more rectangular banners of any size or shape or a banner of any other configuration capable of being tensioned between such spaced parallel tubes. The system is very light weight and, for example, a single 4'×8' banner support of aluminum alloy may weigh less than a pound.

One single-banner embodiment incorporates a pair of spaced hollow mounting tubes which carry opposite edge loops of the banner threaded over the tubes. In an assembled system, the banner is carried on and between the mounting rods, spaced apart, the banner held in tension by a pair of hollow strut members crossed to form an X-bracing arrangement. The struts are made up from a plurality of slip-fit sections which combine to form elongated flexible tubular members which, when assembled in place, cross behind the banner and hold the mounting tubes in spaced parallel relation the flexible rods being somewhat longer than the transversal distance of the assembled structure and so assuming a bowed shape when connected to the mounting tubes. Both ends of each of the flexible struts of the X-bracing include terminal pins which are designed to be accommodated in openings in corresponding resiliently held hub members slip fitted into the ends of the spaced hollow mounting rod members. The openings in the hubs are elongated toward the surface to accommodate the struts over a range of angles between hub and strut. The X-bracing flexible strut members themselves are adjustably constrained at the intersection where they cross behind the banner by a central strap or loop member which allows relative displacement of the intersection along the X-bracing strut members.

Each hub end of one hollow mounting tube member, i.e., the one which carries the lower edge loop of the banner, and becomes the lower hollow mounting rod member in the combined structure, is also resiliently connected to one end of one of a pair of hollow base tube members, the other ends of which converge to intersect and form the legs of an isosceles triangle support base with the lower mounting tube member. The intersection of the base legs is connected by a hollow stabilizing tube member, of one or a plurality of slip fit sections, with the strap surrounding the intersection of the X-bracing strut members to complete and stabilize the mounting structure. Adjustment of the posture of the connecting rod relative to the base triangle correspondingly adjusts the posture of the banner.

The X-bracing tubular struts, particularly in larger models, are preferably made up of plurality of sequentially connected slip jointed tube segments tensioned by a resilient internal cord member of the type commonly referred to as "bungee" cords connected between end pins that are fit into the ends of each of the X-bracing struts as assembled. As stated, the converging base tube members and connecting strut member are also connected together utilizing a loop of resilient cord material which passes in a loop around the strap connecting the X-bracing intersection and extends through the stabilizing tube member segments as a pair of resilient cords, each of which is thereafter separately threaded through one of the base tube members to a terminal eyelet larger than the internal diameter of the base tube member and designed to be captured by the corresponding pin of the X-bracing strut tube when it is assembled in the hub opening in the corresponding hub in the lower mounting tube member.

In this manner, the system can easily be disassembled and assembled by applying tension to pull the connections apart at the hub or along the resilient connecting cords. As with the pins terminating the strut members of the X-bracing, the hubs at the ends of the upper and lower mounting rods may also be held in place by a common connecting resilient cord member attached to inside eyelets provided therein. The network of cords provides sufficient tension to stabilize the assembled unit and enough resistance to allow easy disassembly. The multiple segments of the X-bracing tubular struts readily fold when pulled apart and the connecting rod member segments readily fold with the base members. The banner or mural may be folded while still on the mounting rods or separately and the whole assembly readily stored in a carrying case or tube.

In still other embodiments of single banner units, both the mounting members and the X-bracing struts are constructed to have adjustable lengths. They may be constructed using a co-axial telescoping arrangement so that the lengths of both can be adjusted and banners in a range of sizes can be accommodated on a single mounting device. The telescoping arrangement of the invention also enables mounting tubes and bracing struts to be locked in at any desired length in the range available so that once adjusted the system can be tightened and fixed in place for a particular size banner or mural and, thereafter, changed to accommodate another size as desired.

The triangle base may, optionally, be a removable snap-on support base including members which connect to form a triangle with the lower mounting member and a vertical strut (which may also telescope) connected at the top to the intersection of the X-brace as by a snap-on, snap-together hub and at the bottom to the intersection of the base members using a 3-way connector. The snap-on hub may replace a strap member in any embodiment and any telescoping (adjustable) or fixed unit can be provided with a removable triangle base in another embodiment.

The triangular base, single banner display embodiments readily convert into a continuous-line multi-banner display by simply changing the hub members in the mounting rods from single ended, single port to double ended, double port hubs that accommodate two strut members. In this manner, as many consecutive banners or photomurals or the like as desired can be aligned and locked together, possibly as elements of a much larger picture or display. Each end mural and if desired each consecutive mural may be supported on a triangular base so that the entire length is self-stabilized.

The display system may be arranged using a parallelogram or rectangular construction with banners or panels in spaced back-to-back arrangements as two or four banner rectangular system. Alternatively, in another conceptual aspect, an A-frame arrangement mounts a dual sided looped banner using a single top mounting member and spaced lower mounting members held together with a single X-brace set. This arrangement resembles the conventional "sandwich board" in shape. Units may also form consecutively joined rectangular arrangements with back-to-back banners in which the individual systems join at the ends of the banner rods much in the manner of the triangular base systems. The rectangular configuration is stable in an upright position or on its side as a table or table-top display. Combinations of all types may be constructed to form bridges or other configurations.

In still other configurations, individual, single banner units can be joined together using a hinged swivel arrangement in a variety of configurations with or without triangular support bases. In this manner, as many consecutive units as desired can be arranged side by side in self-supporting configurations.

The stability of the X-brace configuration further allows mounting as by clamping the X intersection over itself to a mounting pedestal for a variety of uses. One such use is a tripod mount that allows adjustment of a mural to be used as a photo background, reflective screen or the like.

BRIEF DESCRIPTION OF THE DRAWINGS

In the drawings wherein like numerals characteristically identify like parts throughout the same:

FIG. 5 is a schematic perspective view from behind an assembled display system in accordance with the invention;

FIG. 6 is a schematic view showing the adjustability of the banner display system of FIG. 5;

FIG. 7 is a rear schematic perspective view showing a tie-down system in conjunction with the display system of the invention;

FIGS. 8A and 8B are schematic views showing connected back-to-back banner systems used in a more complex display;

FIGS. 27A–27M illustrate a variety of additional hub and connecting fittings for use with the systems including several hinged or pivoting connectors;

FIGS. 28A and 28B depict two lengths of crossing or X-brace legs designed featuring a telescoping adjustable length;

FIGS. 32A–32B further illustrate an A-frame construction;

FIGS. 43A–3D illustrate adaptations of a tripod leg to the system of FIGS. 33–36.

DETAILED DESCRIPTION

Figure 1:
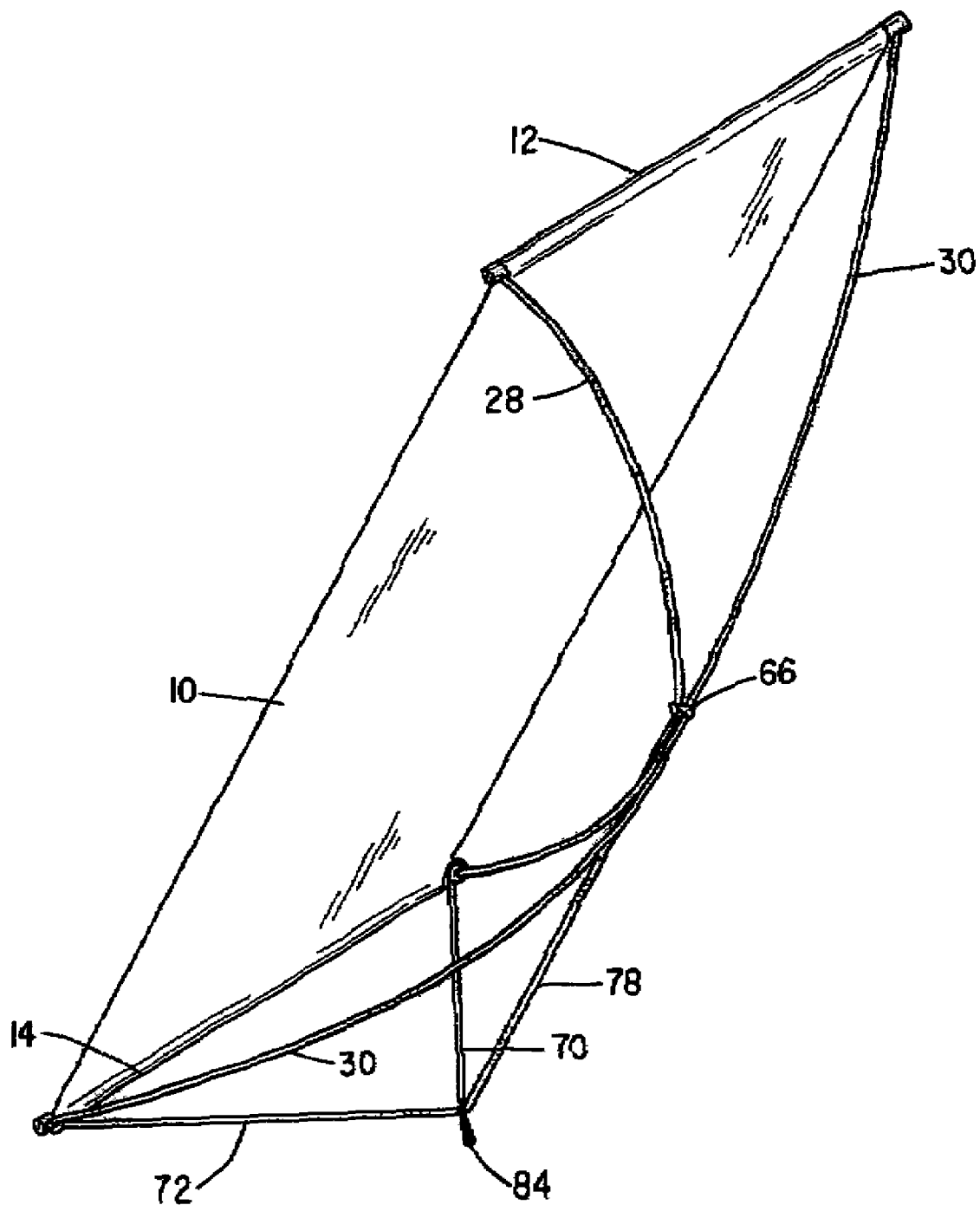
FIG. 1 is a perspective view of an assembled display system in accordance with the invention.

It will be appreciated that the present invention provides a compact, light weight, self-contained support system that comes apart quite easily for storage and transport and that readily assembles without tools into a resilient versatile banner display system with many configurations and applications. This system represents an excellent mode for displaying a banner, photomural, sign or other flexible information conveying display device capable of being carried between spaced mounting rods in an adjustably, generally vertical setup. Hubs and connectors are generally quite interchangeable and many structures convert among a variety of arrangements. The embodiments shown in the drawings illustrate the concept of the system but are not intended to be limiting in any way with respect to other variations which might occur to those skilled in the art. The system can be utilized indoors or outdoors and several devices for holding the displays in place are also illustrated below.

Figure 2:
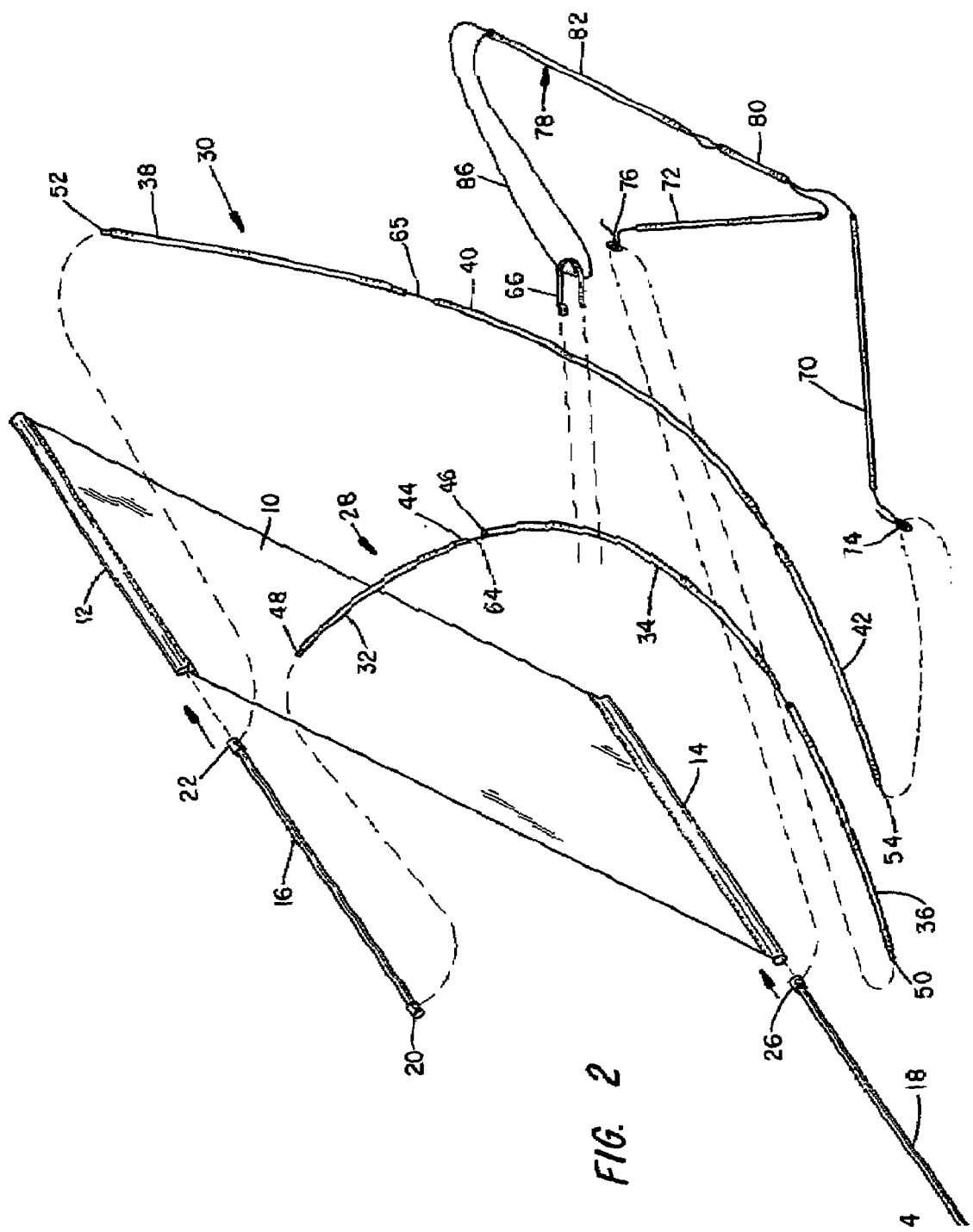
FIG. 2 is a generally blown apart view of the display system of FIG. 1.
Figure 3:
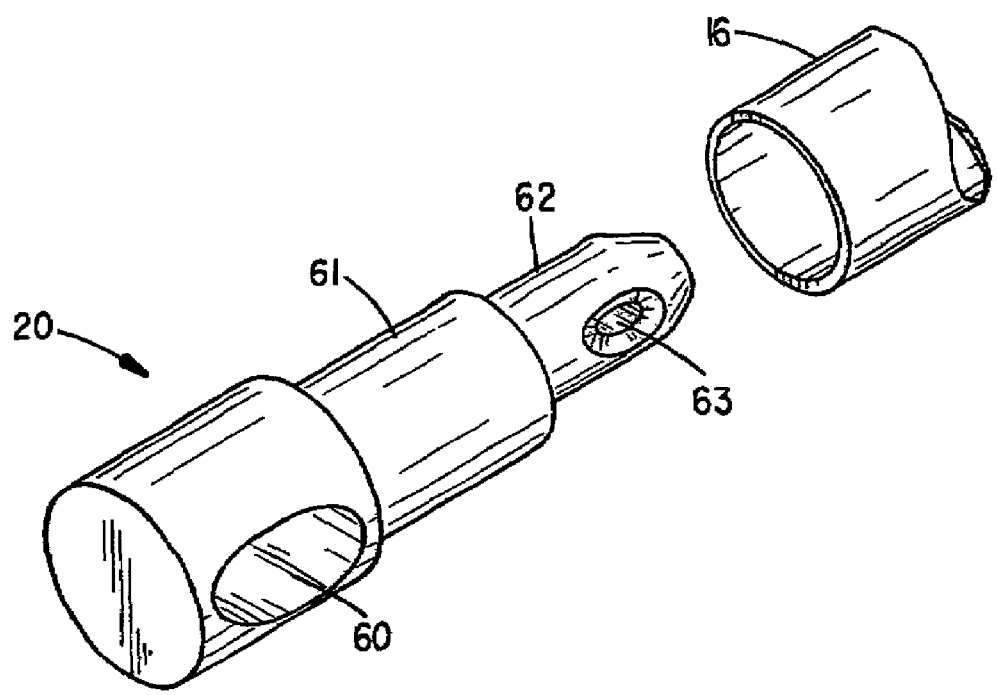
FIG. 3 is an enlarged perspective view showing a typical mounting tube end and mounting tube hub member.
Figure 4:
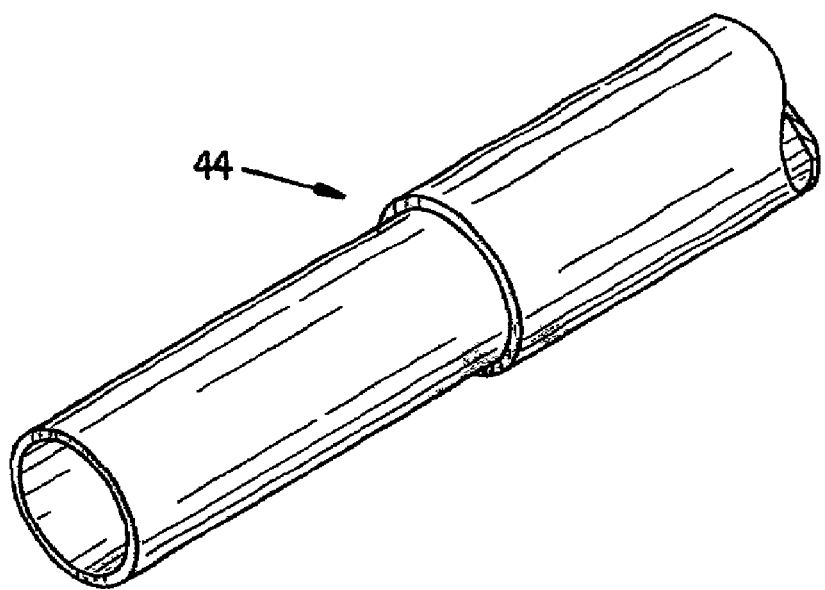
FIG. 4 is an enlarged view of a typical slip fit end utilized in the segmented tube assembly of the system.

FIGS. 1–3 show the general concept in assembly of the banner display system of the invention in which a banner, generally at 10, and having at its ends mounting loop segments 12 and 14. The loop segments 12 and 14 are designed to slip over respective hollow mounting tubes 16 and 18. The hollow mounting tube 16 is provided with end hubs 20 and 22 and, likewise, rod 18 is provided with the mounting hubs 24 and 26. The mounting tubes are held spaced apart by a pair of elongate segmented flexible hollow strut members 28 and 30 with strut member 28 being made up of individual segments 32, 34 and 36 and strut member 30 being assembled from segments 38, 40 and 42. The strut members 28 and 32 are assembled using slip joint members as at 44 which fit the inside diameter of the adjacent hollow strut section as at 46 (FIG. 2). The hollow flexible strut members 28 and 30 are further provided with terminal pins 48, 50, 52 and 54, respectively. The terminal pins are designed to be accommodated in corresponded angled openings in the hub members of the hollow mounting tubes such as 20 which is featured in the enlarged perspective view of FIG. 3.

Hub 20 and the other hubs described herein are typically machined from an aluminum alloy such as 211T3 aluminum. Hub 20 is provided with a necked-down (shank) section 61 designed to fit into the hollow mounting tube 16. The remaining portion of the hub protrudes out of the tube and is provided with a recess 60 designed to accommodate the pin 48 as illustrated in the blown apart view of FIG. 2. The opening of the recess 60 is laterally wider than the diameter of the terminal pins so that the terminal pin may be accommodated despite variations in the addressing angle along in the direction of the elongation with respect to the hub member 20. The hubs 20, 22, and 24, 26, are, in turn, held in the ends of the respective upper and lower mounting tubes 16 and 18 by cords connected through inner openings in section of further reduced diameter 62 the hub such as illustrated in at 63 countersunk at 64 to prevent cord damage.

The segmented flexible hollow strut members 28 and 30 are respectively held together by internal resilient cord members 64 and 65 which are connected between the terminal pins as at 48 and 50 in the case of strut 28. The terminal pins 48 and 50 contain cord connection openings (not shown), but which are similar to opening 63 in the hub member 20 for attachment of the resilient cord.

The composite flexible hollow struts or braces 28 and 30 cross behind the banner 10 to cross brace the structure when each of the ends is inserted in the respective proper opening in the hub as at 60 in hub 20 illustrated in FIG. 3. The crossing position is provided with a retaining strap member as at 66 (as shown in FIGS. 1 and 2) and, as also evident from the figures, the flexible hollow struts become somewhat bowed as they support the banner 10 in tension forcing the upper and lower mounting tubes 16 and 18 apart.

The system is further provided with an integral connected triangular-shaped stable support base that includes a pair of hollow tube base members of equal length 70 and 72 which form an isosceles triangle with the lower hollow mounting rod 18 connected by respective eyelets 74 and 76 which are designed to accommodate terminal pins 54 and 50, respectively, prior to those terminal pins being inserted in the respective hubs 20 and 26 of the lower mounting tube member 18. In this manner, one end each of the members 70 and 72 are attached to the lower hollow mounting tube 18. The remaining ends converge and are further connected with a segmented stabilizing tube member 78 having segmented portions 80 and 82 and which connects between the strap 66 and the converging free ends of the members 70 and 72 at 84 assuming thereby a generally vertical posture. As can best be seen in FIG. 2, the entire supporting structure including members 70, 72 and 78, together with eyelets 74 and 76, are interconnected and also connected to the strap 66 via a continuous common resilient cord loop as at 86.

Once assembled, the banner support system can be moved about and picked up by grasping the back in the vicinity of the strap 66 as it remains quite stable. As shown in FIG. 5, assembled member 78 becomes a vertical stabilizer between the intersection of the flexible struts 28 and 30 and the corner of the triangular base at 84. This provides a structure which geometrically includes at the same time many triangles which create a very stable structure. FIG. 6 depicts that the posture of the whole structure can be tilted forward and backward simply by changing the angle between the member 78 and the vertical pull that whole structure back or push it forward and it will remain stable in the extreme positions or in any position therebetween because of the elastic nature of the assembly. FIG. 6, though not limiting, illustrates a 30° range which includes tilting the banner forward 15° at 90 and back 15° at 92. The vertical position being shown at 94. The elastic nature of the assembly utilizing a plurality of resilient cord members results in a structure which is stable and supportive, yet can be shifted or distorted and one which will remain in the shifted position.

FIG. 7 shows the same structure in a staked or outdoor application. Whereas the normal application is indoors where the banner system is not subjected to wind or other disturbances which may cause it to blow down, it can be readily staked outdoors as by cords 100 and 102 as shown in FIG. 7. In addition, the members of the base triangle may also be staked to the ground as shown at 104, 106, 108 and 110.

Figure 9A:
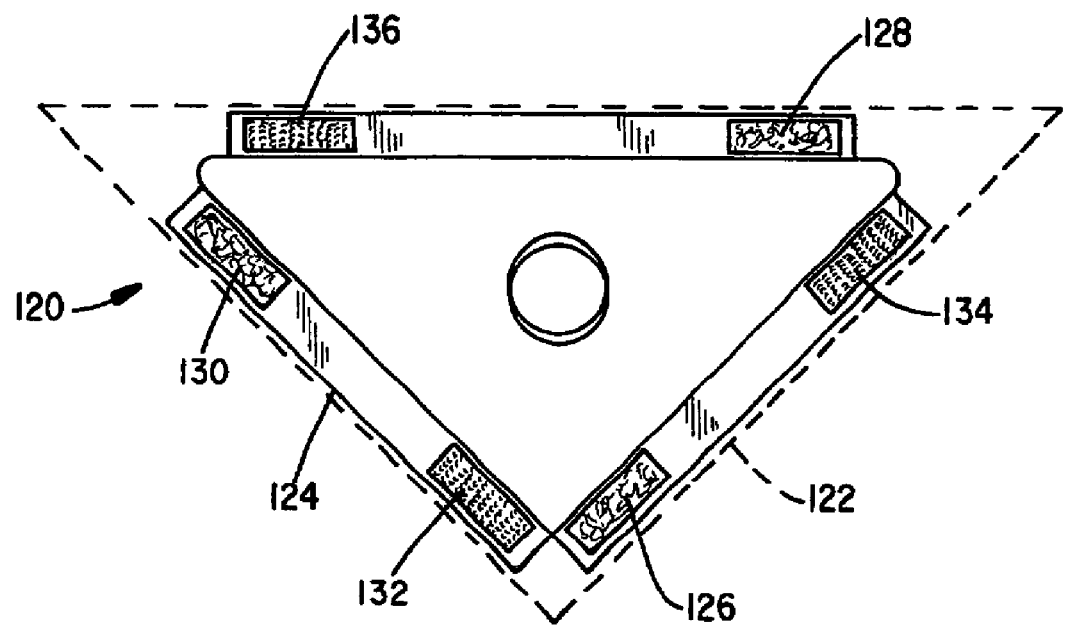
FIG. 9A is a plan view of a right triangle shaped water bladder hold-down device for stabilizing the stand base of the invention.
Figure 9B:
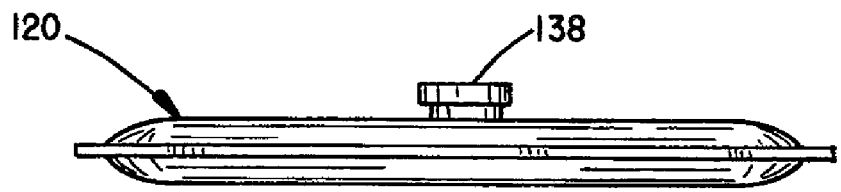
FIG. 9B is a side elevational view of the water bladder of FIG. 9A.

Another outdoor or indoor stabilization system is shown on FIGS. 9A–12, triangular sand bags, water bladders or other such shapes, or the like, can be connected to hold down one or more of the lower base members to retain the system in place, if desired. FIG. 9A depicts a plan view of a water bladder generally at 120. A triangular outline depicting the full equivalent right triangle at 122 and a solid line depicting the actual shape at 124. A hook and loop attaching system may be utilized with the water bladders and hook patches are represented as at 126, 128 and 130 with loop patches illustrated at 132, 134 and 136, respectively. The side elevational view of FIG. 9 illustrates a similar bladder with a filler cap at 138 for the addition of water as the weighting material.

Figure 10:
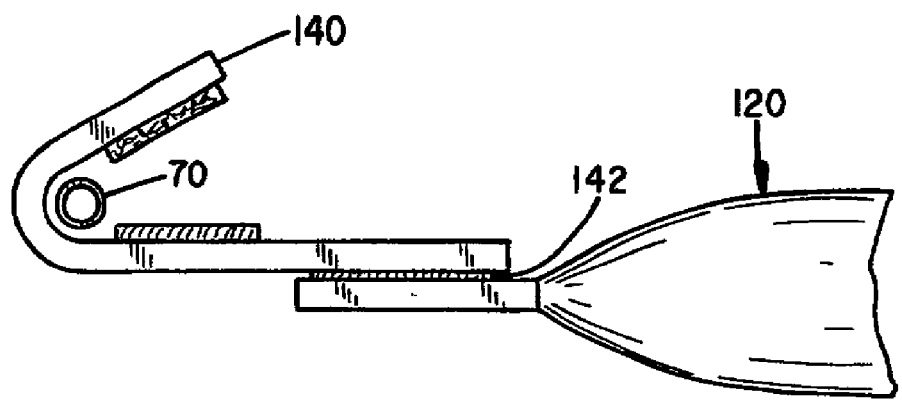
FIG. 10 is a plan view detail showing connection of a water bladder in accordance with FIG. 9A over a base tube member of the stand base of the invention.

FIG. 10 illustrates use of a hook and loop connecting system in which a hold-down connecting member 140 is looped about a base tube member as at 70 and also connected by a second hook and loop connection at 142 to a bladder as at 120.

Figure 11:
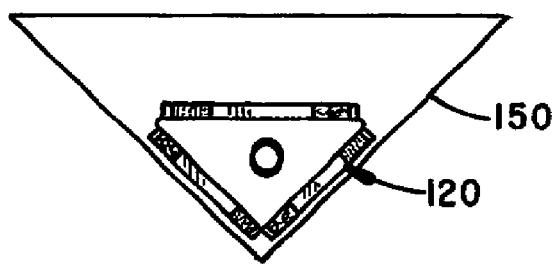
FIGS. 11 and 12 depict various patterns of water bladders usable with various sized displaced ends in accordance with the invention.
Figure 12:
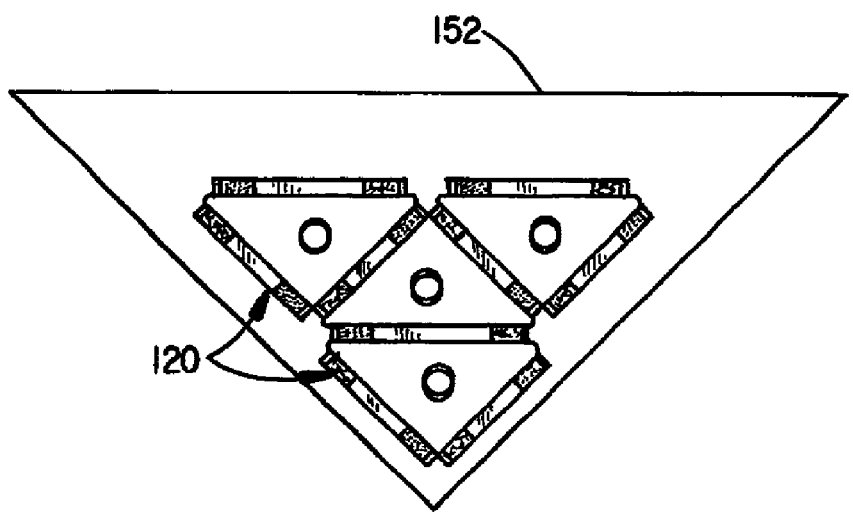

FIGS. 11 and 12 further illustrate the placement of single and multiple water bladders relative to smaller and larger triangular bases at 150 and 152. In this manner, a variety of such weighted water bladders can be combined to hold down large or small triangular bases in any configuration and simply hook together utilizing hook and loop connecting systems thereby providing the necessary additional weight to stabilize the base without interfering with the display.

FIGS. 8 and 8A depict the placements of the banner support or display stand systems of the invention back to back to display banners in opposite directions somewhat like the concept of the tradition sandwich board. Thus, two system 160 and 162 mounted back to back can further be connected by top and bottom members as at 164, 166, 168 and 170 to form a composite box structure for added stability. It will further be appreciated that such a box structure can accommodate 4 individual units at 90° to produce a 4-banner, 4-sided display.

To assemble the banner display support system of the invention, the terminal pins of the flexible X-bracing struts 28 and 30 can readily be pulled out of the hubs on the upper and lower mounting rods and thereafter the system simply can be collapsed into its elemental states by tensioning the cords in the members 28, 30, 78 thereby reducing them to their segmental size. These, along with the two banner mounting tubes, possibly with the banner still attached or with the banner removed and rolled up, can easily be stowed within a rather small container such as a rounded canister for storage and transport. The system, thus, is a knock-down or collapsible, readily assembled banner stand which has flexibility and versatility realizing that the banner can be displayed at any of many angles forward and back of the vertical and can be staked or otherwise held for outdoor applications. The system simple of construction requiring only elastic cord elements and segmentally slip jointed tubing with terminal pins, together with a pair of banner mounting tubes having resiliently connected end hubs designed to adjustably accommodate the terminal pins. It will be appreciated that any flexible fabric can be used for the banner including flag nylon, velvet loop, wall carpet, vinyl, other polymers and even some papers. Graphics can be one or two sided and the banner may be reversible. Many patterns can be described using multiple units and, of course, any number of banners can be interchanged using the same structure. It will further be appreciated that the structure can be made any desirable size and utilize fewer or more interconnected segments at the discretion of those skilled in the art and remain within the confines of the scope of the invention.

Figure 13C:
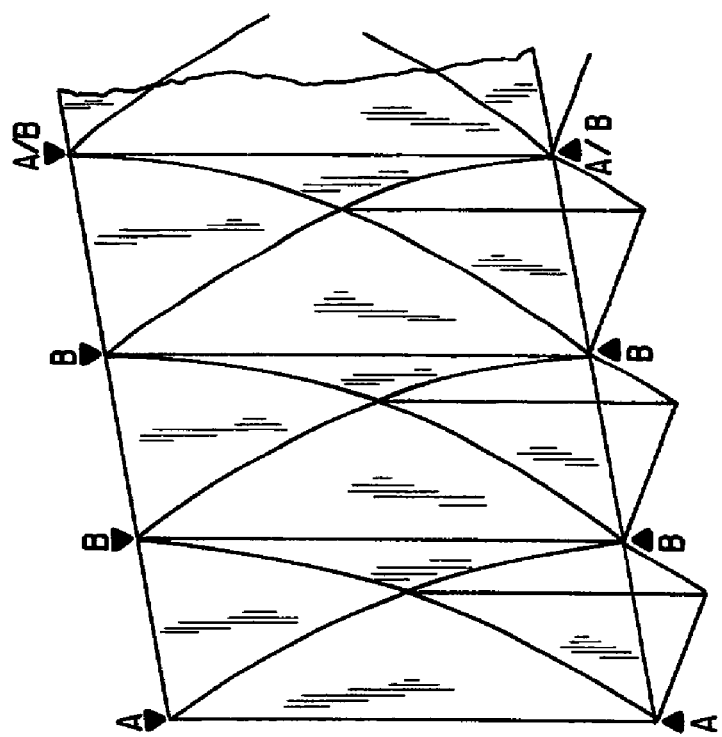
FIGS. 13A and 13C depict in-line combinations of the embodiment of FIGS. 1–7.
Figure 13B:
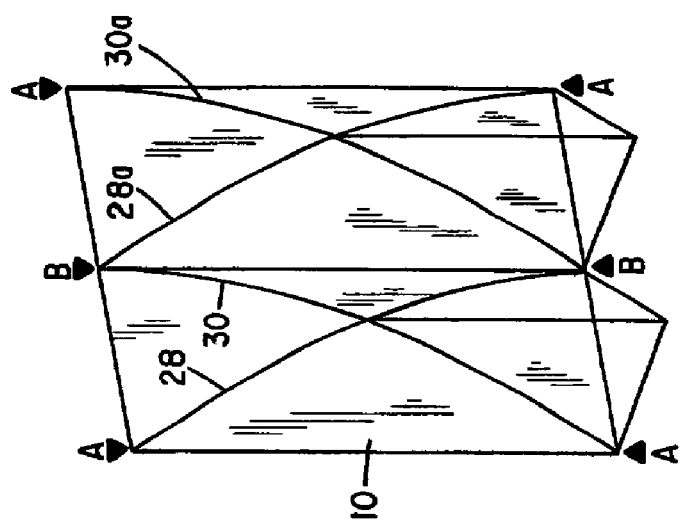
Figure 13A:
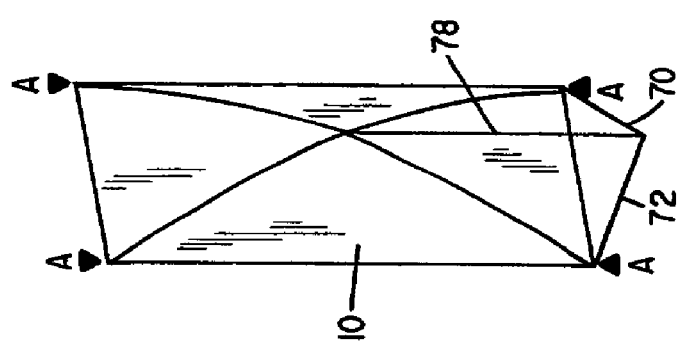

An important aspect of the invention is the relative simplicity of the concept of the self-contained support system of the invention together with the adaptable versatility that enables the system to expand and be easily modified to accommodate a proliferation of useful forms. FIGS. 13A–13C depict the formation of a linear combination of the triangular base embodiment of FIGS. 1–7 in which any number of banners 10 may be consecutively mounted and aligned to produce a larger photomural or banner or to display different images consecutively. Add-on or consecutive assembly can be achieved by simply replacing the single ended, single bore type hubs, such as shown at A in FIGS. 14A and 14B, with double ended, dual bore hubs, as shown at B in FIGS. 15A and 15B, where banners are to be joined. In this manner, the hub will accommodate successive cross brace or strut members as at 30 and 28A in FIG. 13B. FIG. 13C depicts the attachment of additional units with the last hub being depicted as A or B depicting the option of adding additional units to the display or terminating it at that point.

Figure 14A:
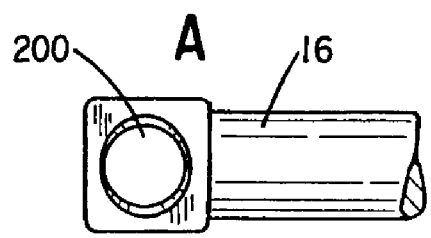
FIGS. 14A and 14B depict details of one single bore connecting hub (A hub) for use in assembling the support systems of the invention.
Figure 14B:
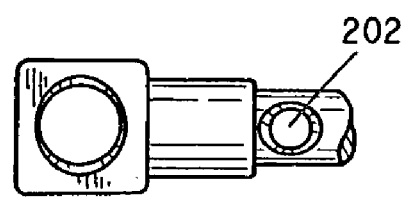
Figure 15A:
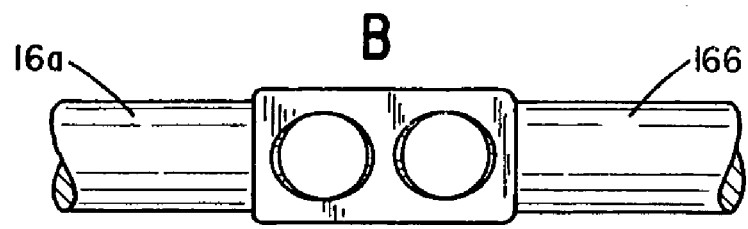
FIGS. 15A and 15B depict a dual bore connecting hub with the invention.
Figure 15B:
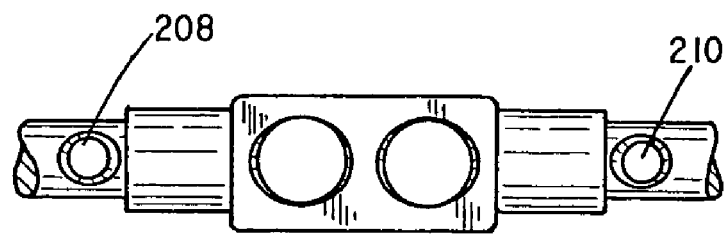

The bore 200 of the A hub of FIG. 14A is shown inserted into an end fragment of a tubular member 16 and without the tubular member in FIG. 14B with bungee cord eyelet 202. These eyelets are as previously described in accordance with other embodiments. Likewise, the double ended, dual bore version B is shown inserted into fragmentary tube 16a and 16b in FIG. 15A and bungee bores 208 and 210 are shown in FIG. 15B without the tube 16a and 16b.

Figure 16A:
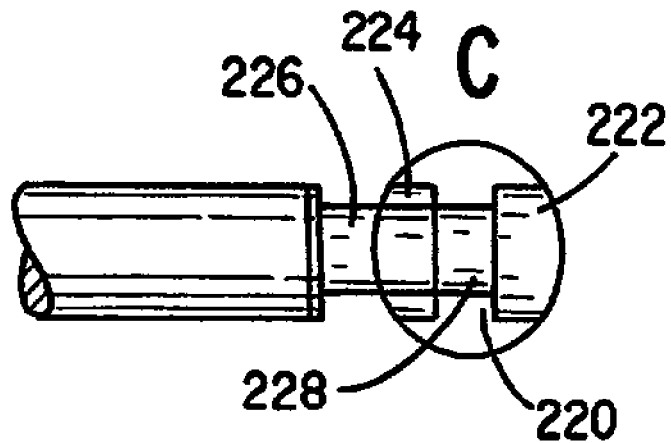
FIGS. 16A and 16B depict one hub locking system associated with a hub configuration of the invention.
Figure 16B:
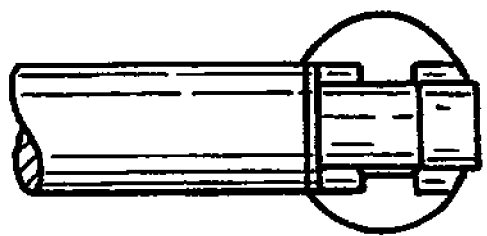
Figure 22A:
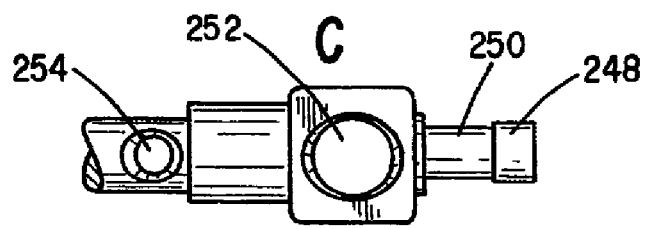
FIGS. 22A and 22B illustrate one hub used in the construction of the rectangular banner display support system.
Figure 22B:
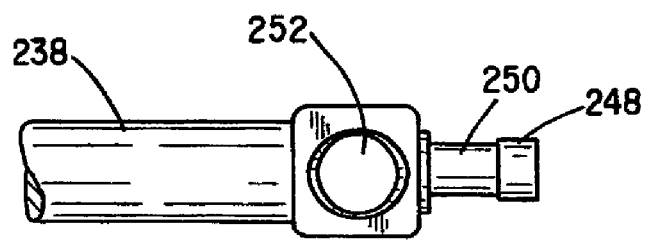

FIGS. 16A and 16B illustrate an alternative self-latching or self-locking hub arrangement which may be utilized with any of the hubs illustrated. In this arrangement, each hub A, B or C (FIGS. 22A and 22B) is provided with a bore 200 having a central opening 220 that is smaller than the adjacent recesses 222 and 224 of larger bore on either side thereof thereby forming a narrowed or necked-down passage. Each corresponding strut terminal pin or other terminal pin on the hubs has a corresponding end knob as at 228 of a diameter slightly larger than the remainder or shank of the pin. The knob 228 is just able to slip through the central opening 220 in the bore 200 as shown in FIG. 16A. In FIG. 16B, the end knob 228 is beyond the central opening 220 and so is due to resume an angled posture in accordance with the bowing of the strut the knob 228 thereby preventing withdrawal of the pin 226 and locking the strut in position. The rectangular systems also lock in a similar manner as will be described below.

Figure 17B:
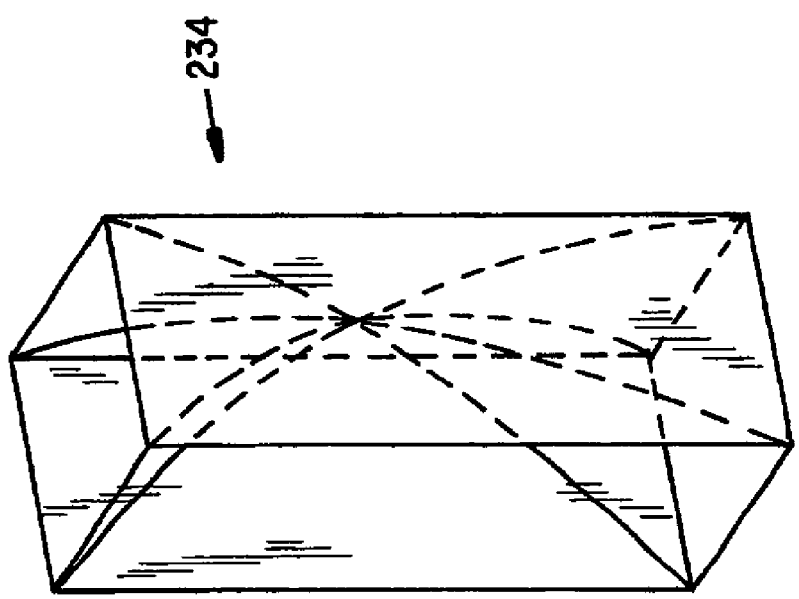
FIGS. 17A and 17B depict two assembled rectangular banner display support systems.
Figure 17A:
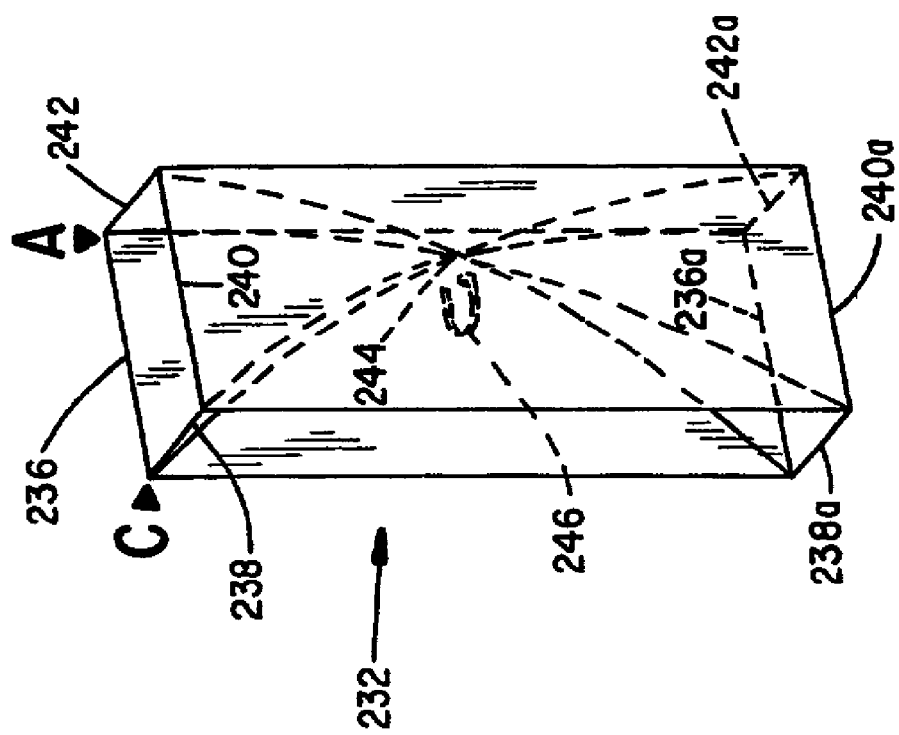

FIGS. 17A and 17B illustrate different rectangular or tower banner display arrangements, generally at 232 and 234, respectively, suitable for mounting two, three or four banners about the size of the assembly. In this arrangement, four upper tube members as at 236, 238, 240 and 242 and four corresponding lower tube members as at 236a, 238a, 240a and 242a are provided. Back-to-back X-bracing strut configurations similar to those previously described in conjunction with the triangular system are provided which converge centrally as at 244 and are retained as by a strap member 246. Detail of these need not be repeated. Two X-braced strut configurations suffice to create a sufficient and stable tension balance in the structure to support and expand 2–4 banners.

As indicated by the letters in FIG. 17A, the opposite and parallel cross tube members 238 and 242 carry terminal hubs of a type C (FIGS. 22A and 22B) which include a terminal pin having a knob 248 with a smaller shank 250, a single bore 252 and cord tie opening 254. The pair of tube members at right angles to these and parallel to each other, tubes 236 and 238, carry type A hubs (FIGS. 14A and 14B), the bores of which accommodate the terminal pins of the type C hubs, with locking knobs 248. The openings or bores as at 252 in hubs C correspondingly accommodate the terminal pins of the X-braced struts which lock in the manner illustrated in conjunction with FIGS. 16A and 16B. Upon assembly, the strut braces, of course, are locked into the bores in the hub C and so to the ends of the corresponding tubes 238, 242 and 238a and 242a. Consequently, the struts push the quadrilateral end structures apart to tension any banners mounted therebetween and, at the same time, force the knobs 248 of the hubs C off center in the corresponding hubs A, thereby concurrently completing the self-locking of the assembly.

Figure 19:
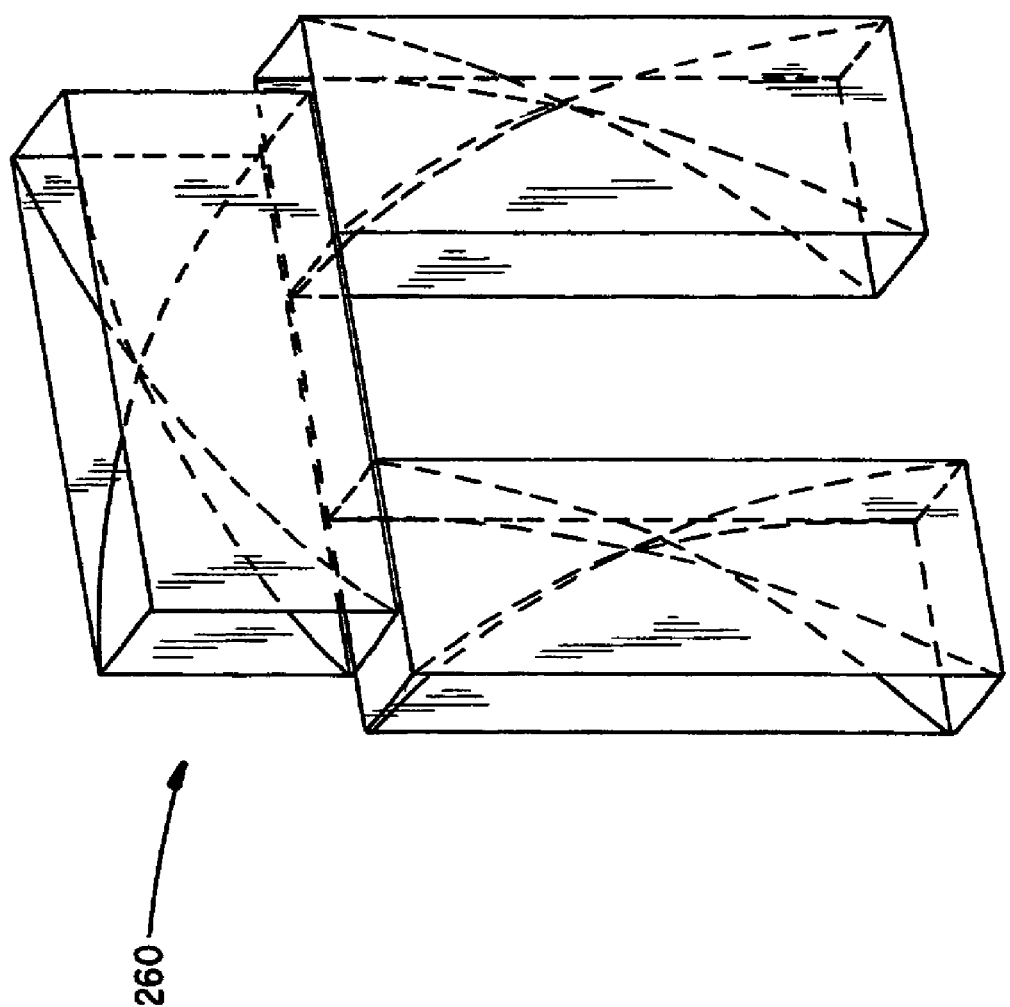
FIG. 19 shows a combination of vertical or tower rectangular banner display arrangements with a horizontal display in an arch or bridge arrangement.
Figure 20:
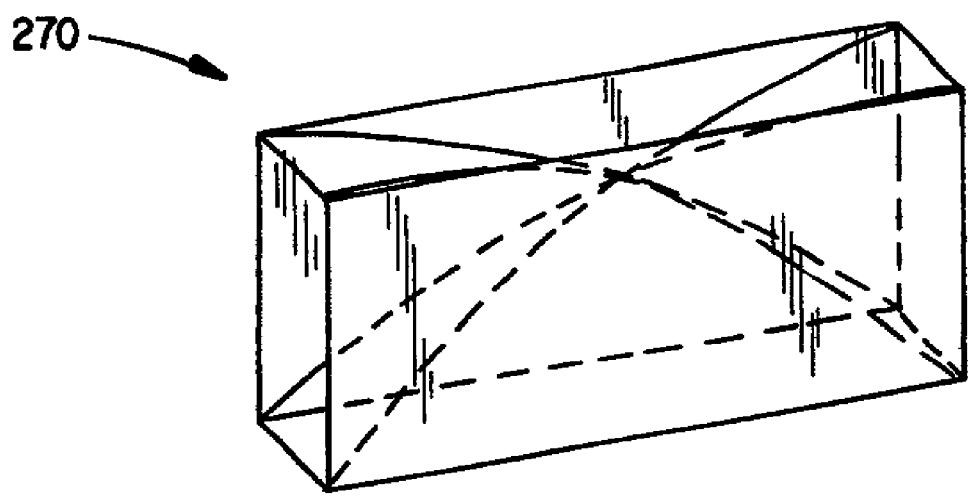
FIGS. 20 and 21 illustrate two horizontal rectangular banner display deployments.
Figure 21:
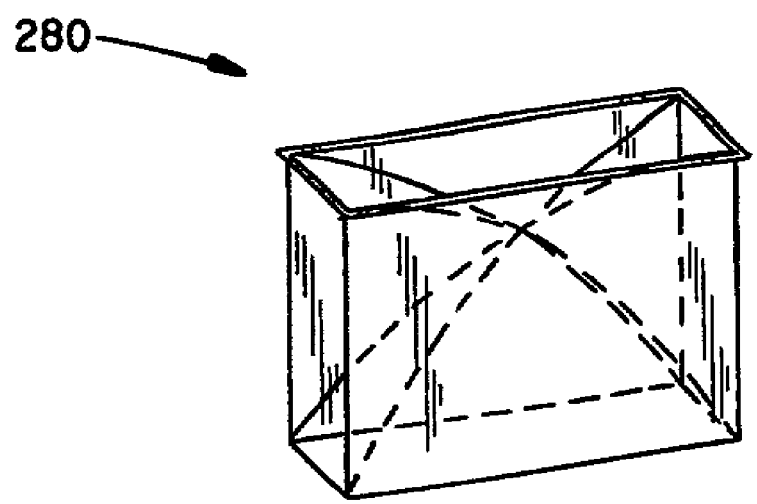

These rectangular or "box-kite" banner display embodiments are light, but very stable, as locked into place and, as shown in FIGS. 19, 20 and 21, can be arranged as arch or bridge structures as at 260 and for uses as horizontal configurations as at 270 and 280.

Figure 18:
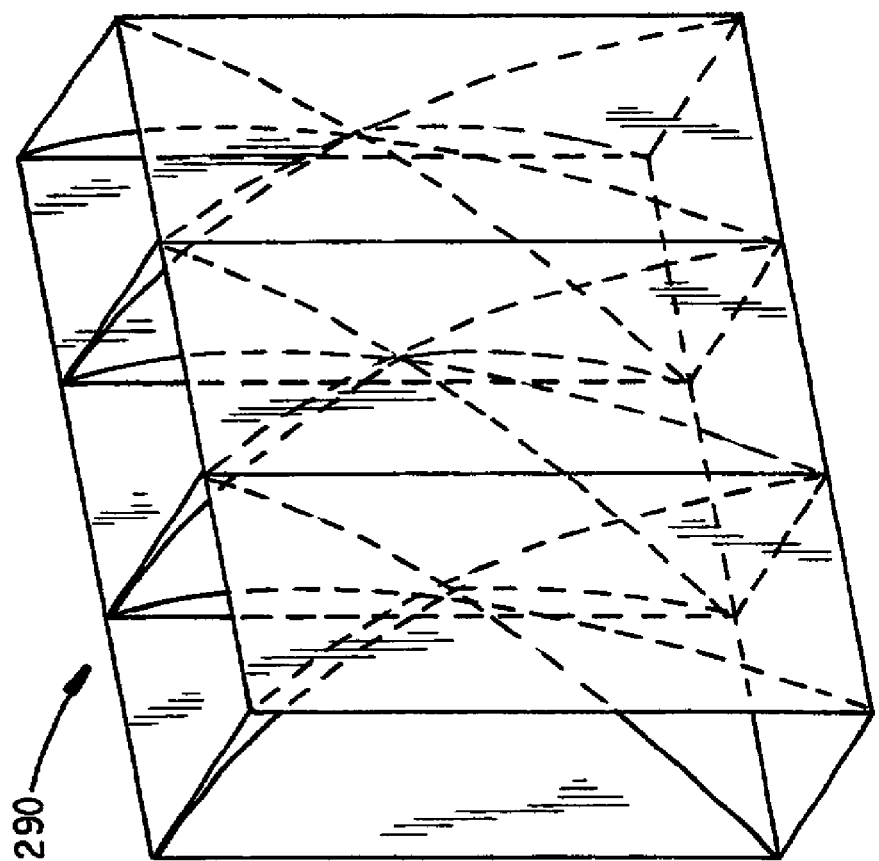
FIG. 18 illustrates a consecutive rectangular banner display arrangement.

The quadrilateral or box-kite display systems also readily lend themselves to being joined in multi-unit consecutive arrangements as illustrated in FIG. 18 at 290. In that arrangement, as in the consecutive triangular base arrangements of FIGS. 13B and 13C, joined or can be accomplished by simply replacing the type A hubs with type B hubs (FIGS. 15A and 15B) in the intermediate units which will serve to self lock the units together upon assembly.

Figure 23:
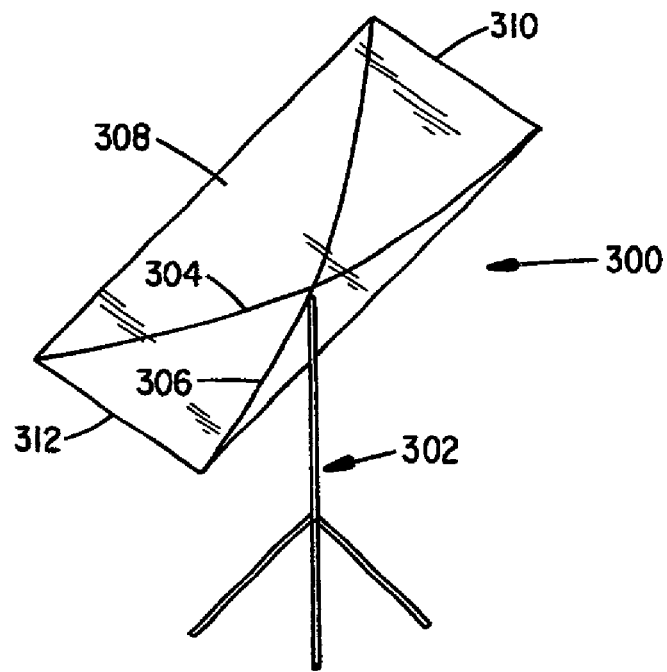
FIG. 23 depicts a "baseless" X-braced banner display arrangement used as a tripod mount.
Figure 24:
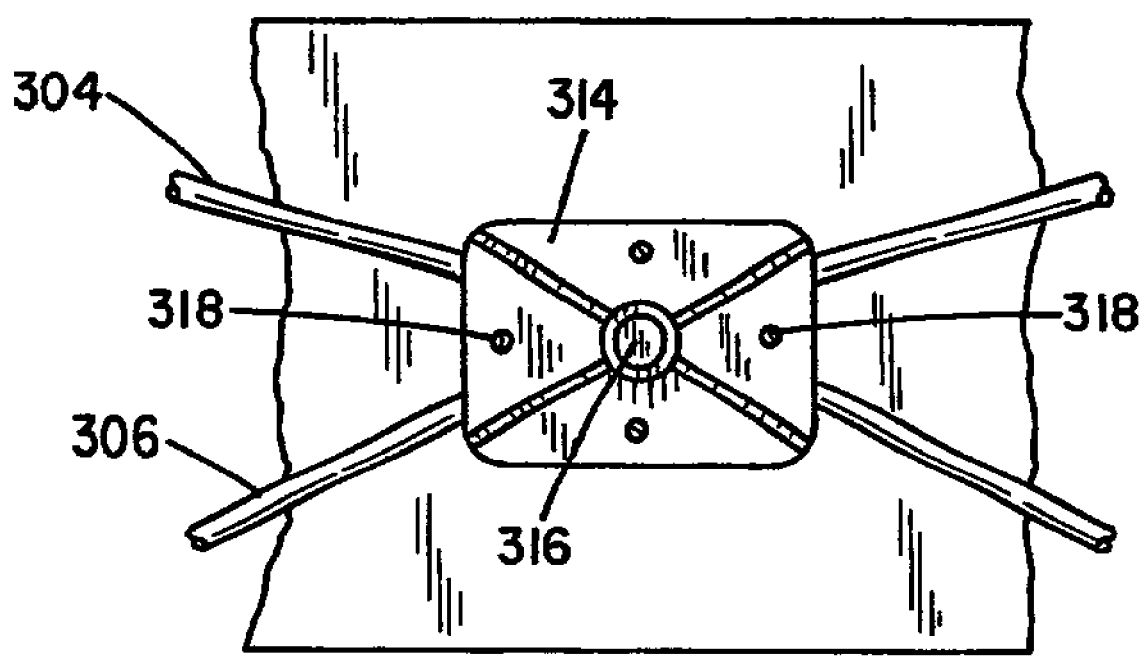
FIG. 24 is an enlarged drawing of a clamp usable to attach the banner display of FIG. 23 to a conventional tripod.

Another embodiment of an X-braced banner display in accordance with the invention is the subject of FIGS. 23 and 24 in which an X-braced mounted banner, generally 300, is mounted on a conventional tripod, generally 302. That embodiment includes X-braced strut members 304 and 306 tensioning a banner 308 between mounting rods located beneath 310 and 312. The tripod 302 is provided with a mounting clamp, one side of which is shown at 314 in the enlarged detail of FIG. 24, which attaches to the tripod 302 in a well-known fashion by means of a threaded connection at 316. The clamp with its opposite side, not shown, is fixed to the intersection of the X-brace members 304 and 306 as by using a plurality of threaded fasteners at 318 to fix the clamp members together over the X-brace. This arrangement can be used to support and carry a photo background of any color or reflectivity, in a highly maneuverable manner as for photographic background or accent in studio work. In addition, the system may be animated by connection to a mechanized means, if desired.

Any of the connected unit multi-banner systems and the single unit rectangular systems may also be tethered or otherwise anchored for outdoor use. The X-bracing construction and banner support assembly and disassembly of those embodiments of FIGS. 13A–13C, 17A–20 and 23 is as described in relation to the embodiments of FIGS. 1–7. The multiple embodiments described serve to illustrate the adaptability and versatility of the banner display system of the invention.

Figure 25A:
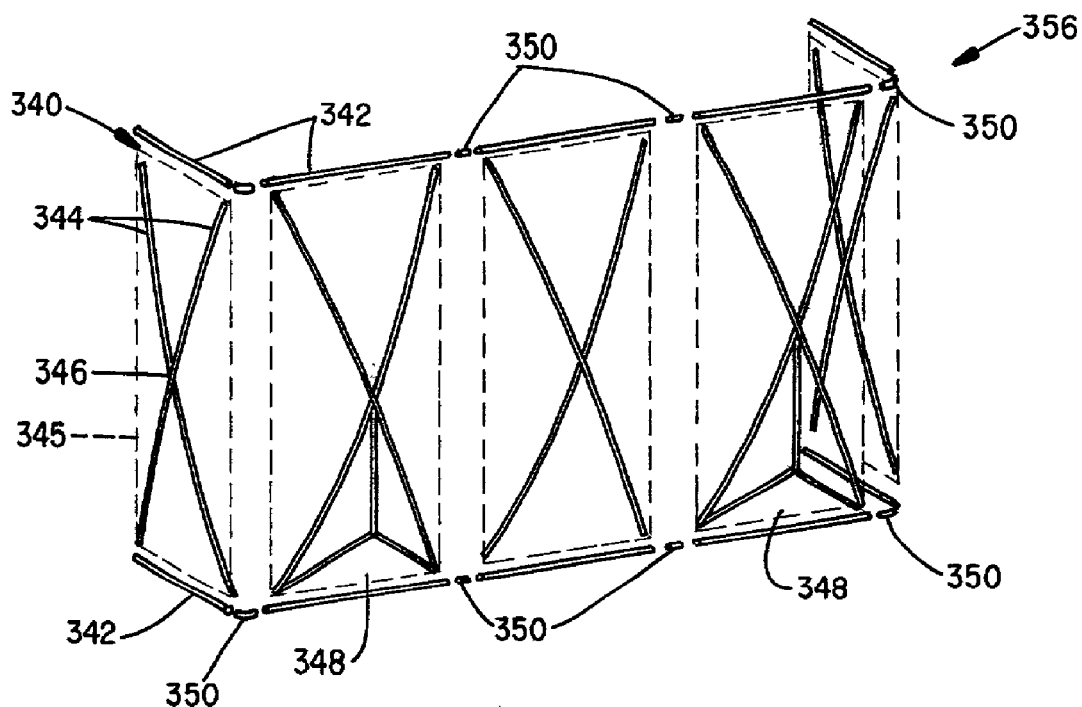
FIGS. 25A–25C depict perspective views of a variety of additional multi-unit arrangements which may employ hinged or swivel connectors between units.
Figure 25B:
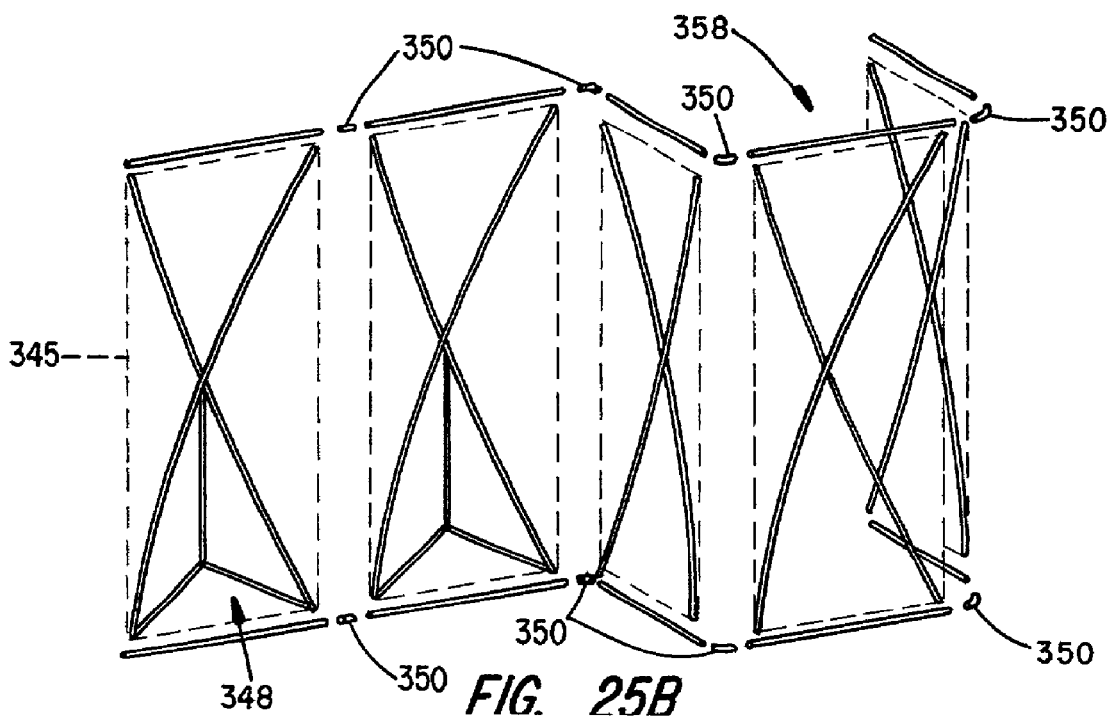
Figure 25C:
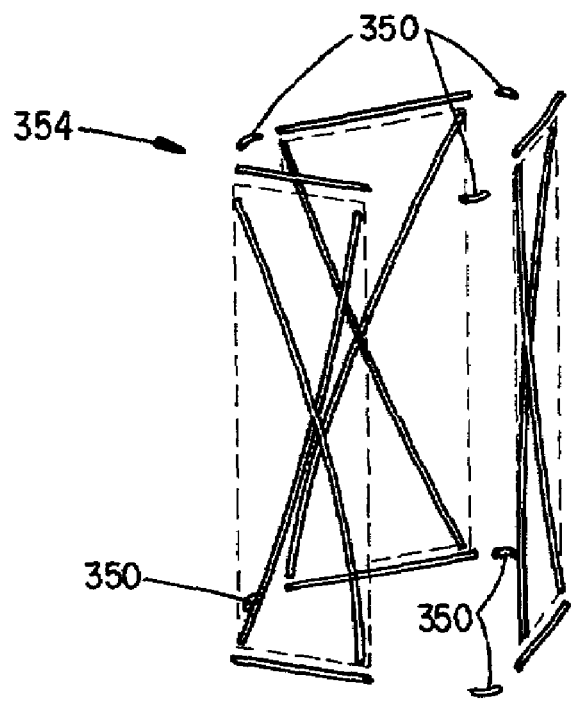
Figure 27A:
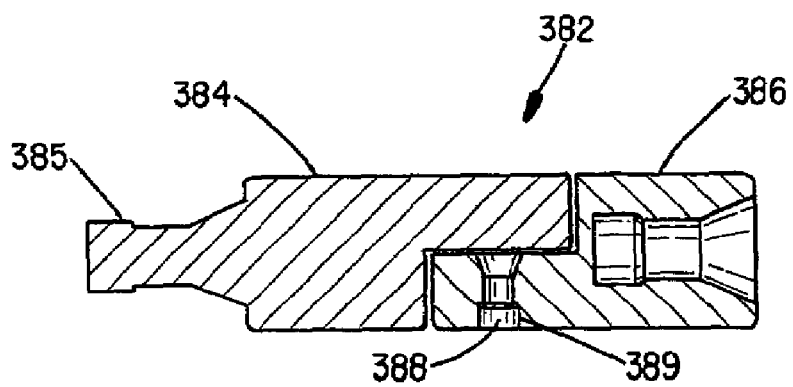
Figure 27B:
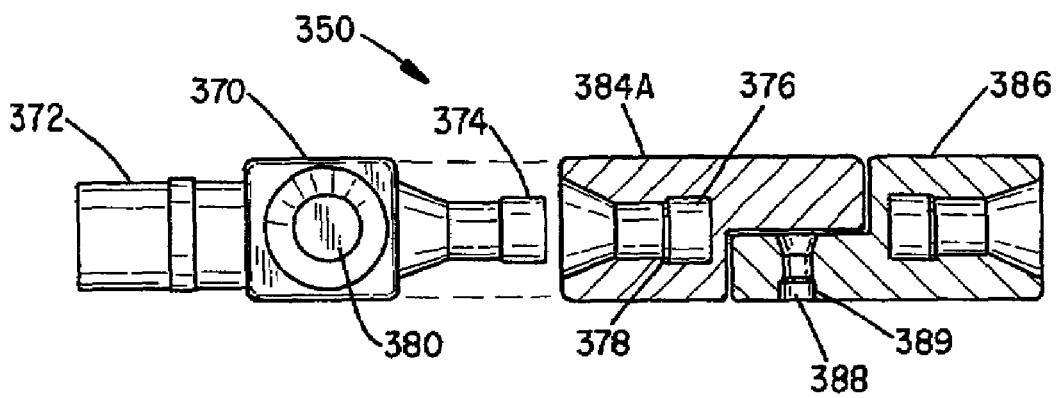
Figure 27C:
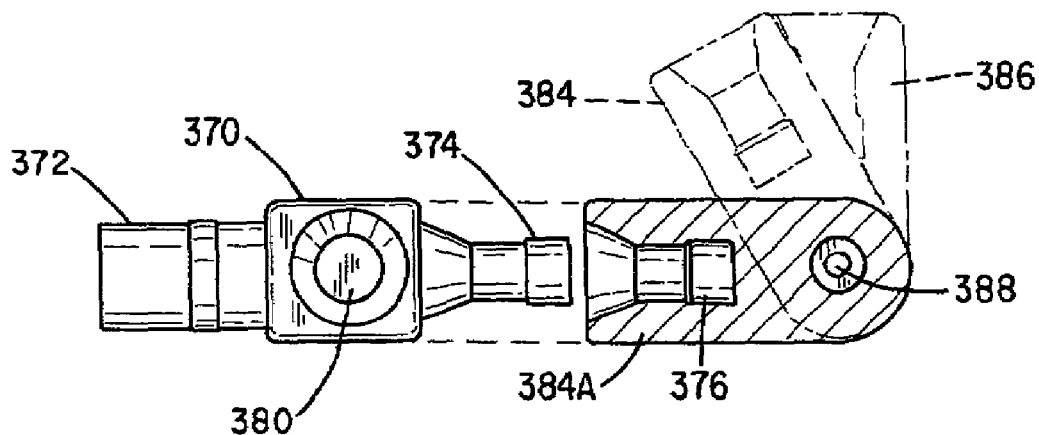
Figure 27D:
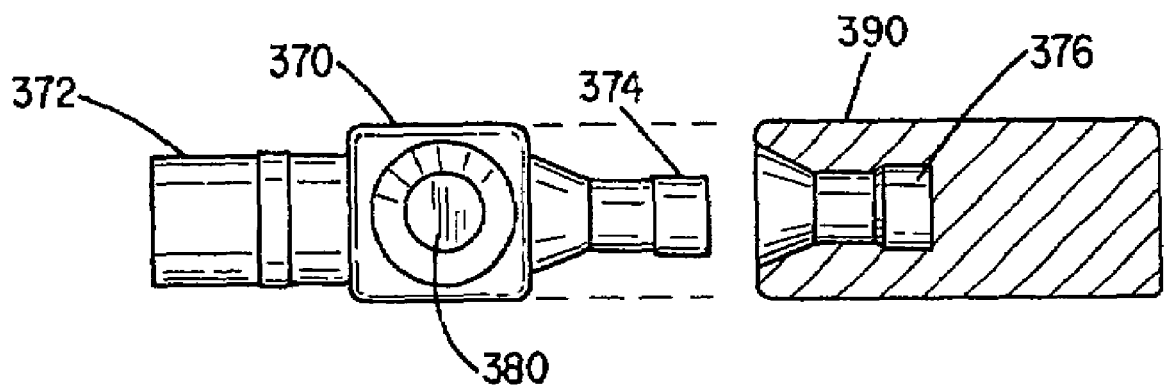
Figure 27E:
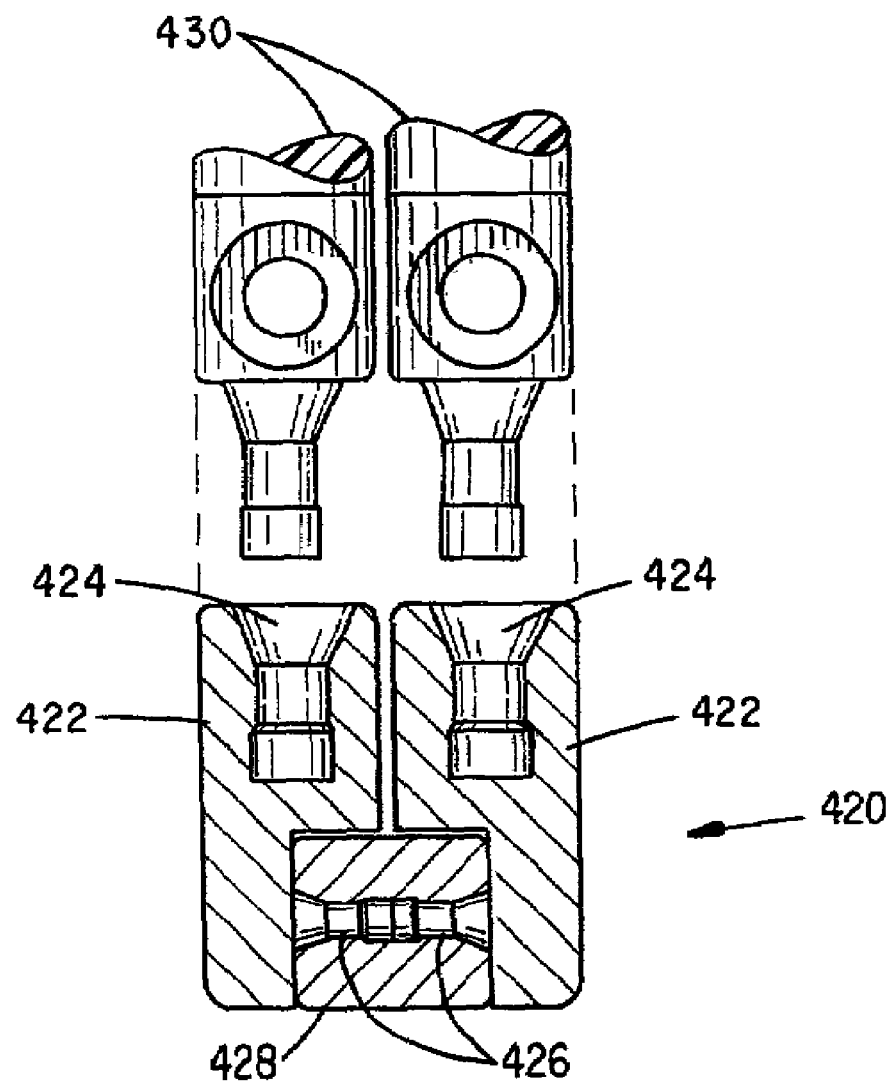

Another aspect of the invention is depicted in FIGS. 25A–25C which illustrate several multiple unit configurations using in-line and/or hinged unit connectors between adjacent mounting rods. Some individual units as at 340 include top and bottom mounting rods 342 spaced by X-brace poles 344, the intersection of which may be retained as at 346 by a strap member as above or by other devices such as shown in FIGS. 27L and 27M or a snap-together, snap-on hub as disclosed in conjunction with FIG. 27K. This baseless unit tensions and supports banners or murals retained as indicated by the broken line 345 but is not self-supporting and is usually used in combination with other self-supporting units, which may include an integral cord-retained triangular support base as at 348 and as has been described or a snap-fit removable stand base such as that shown in FIG. 31 and which readily adds to any baseless unit. The consecutive mounting rods of the multi-unit display assembly may be joined by common hinged or swivel fittings as at 350 or linear or in-line connectors 352 which add configuration flexibility. Examples of some fittings are better illustrated in FIGS. 27A–27E where they are greatly enlarged. As will be explained, these fittings or parts are designed to interchangeably snap fit together and pull or pop apart to disconnect and allow the user to readily connect and disconnect the units from each other and readily alter arrangements in multiple unit configurations. The parts themselves of more than one piece also come apart in the same manner although fits are tighter.

Figure 25D:
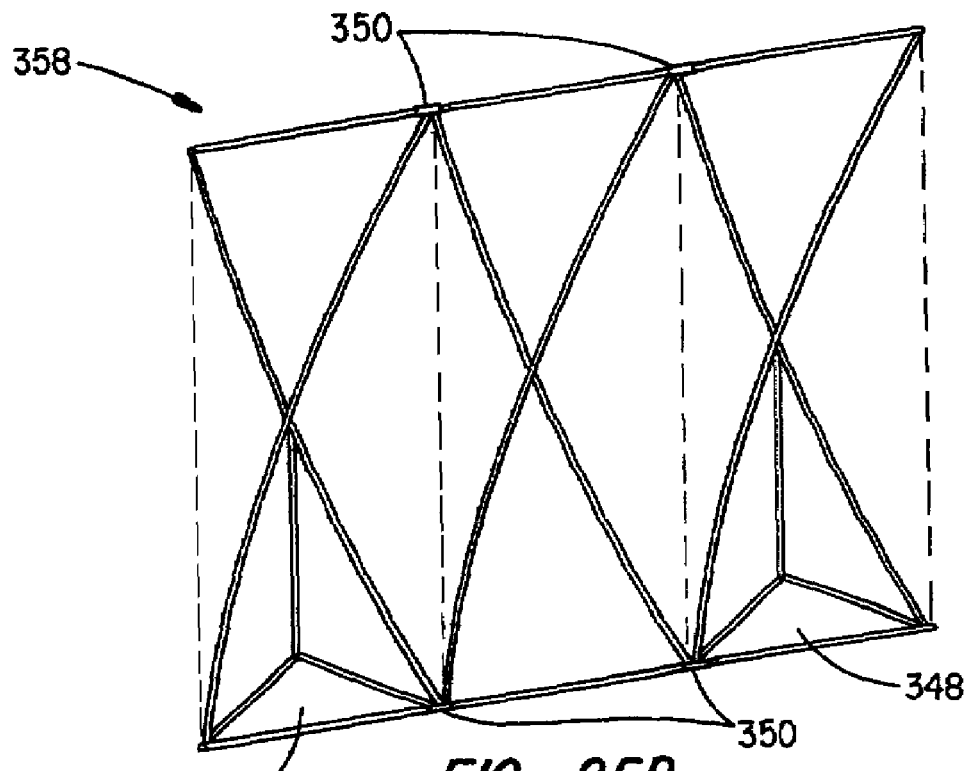
FIG. 25D depicts a perspective view of an alternative linear or in-line multi-unit arrangement.
Figure 25E:
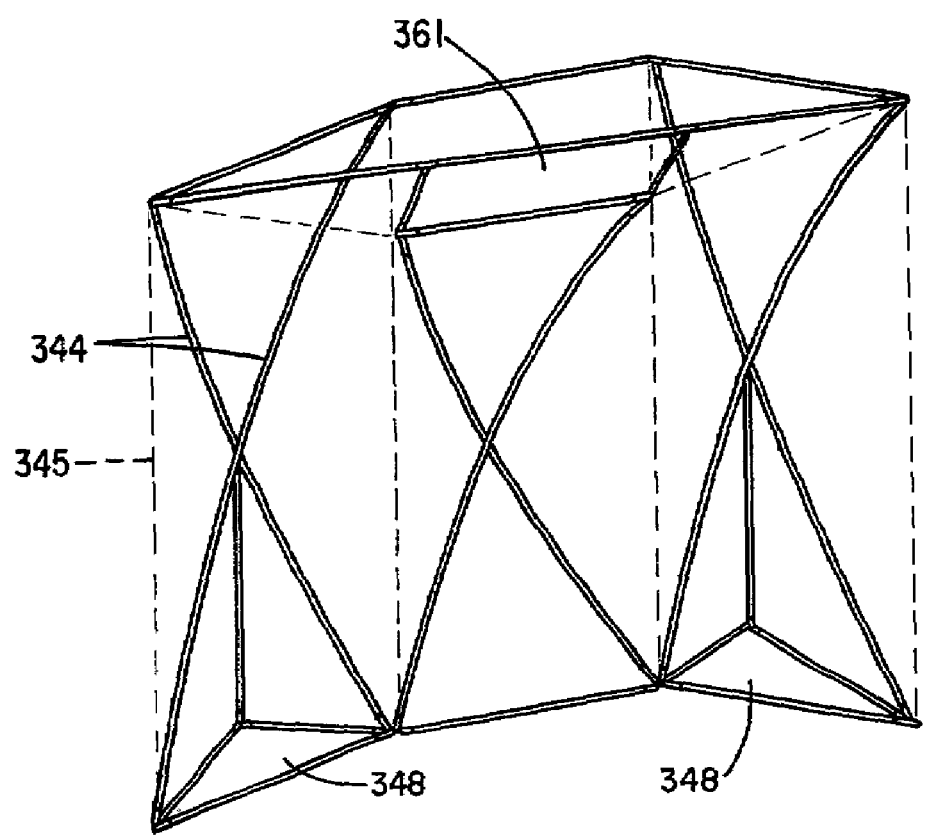
FIG. 25E is a perspective view of a composite booth-type arrangement.
Figure 25F:
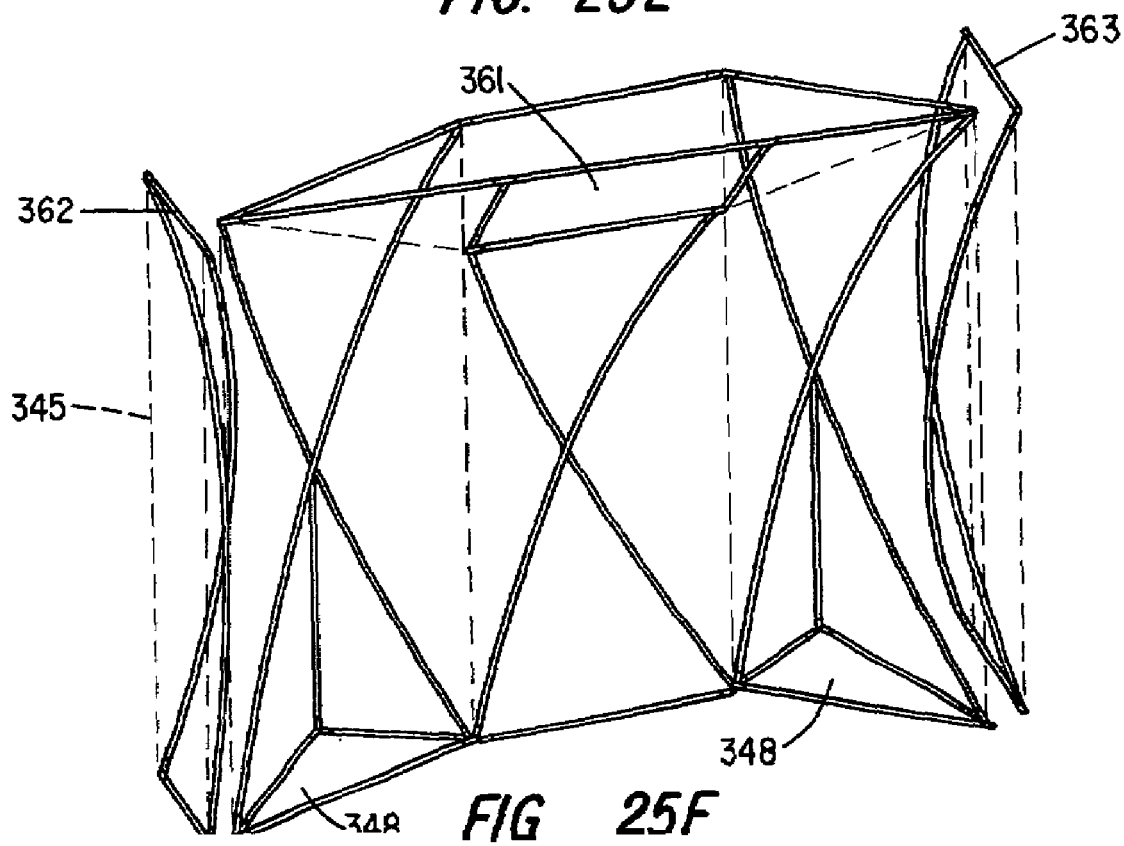
Figure 26A:
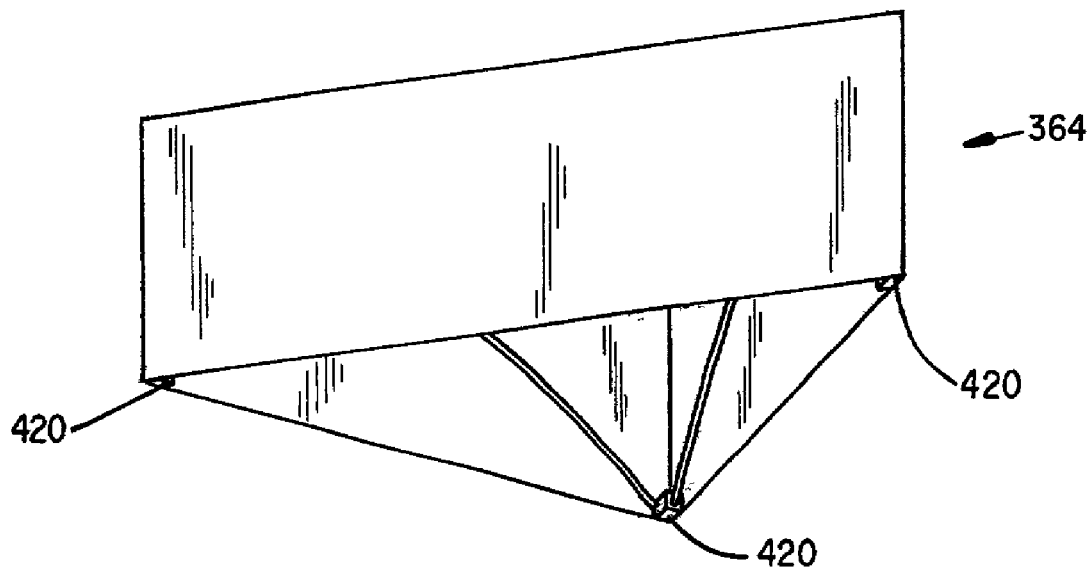
FIGS. 26A–26D depict consecutively connected units using fittings connecting adjacent mounting members to form a variety of end-to-end polygon shapes seen in perspective.
Figure 26B:
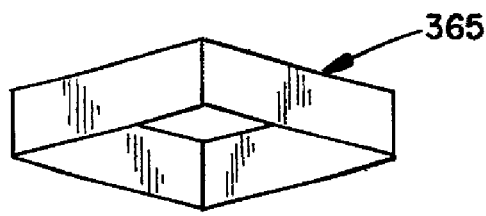
Figure 26C:
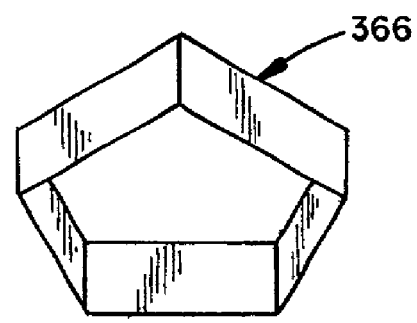
Figure 26D:
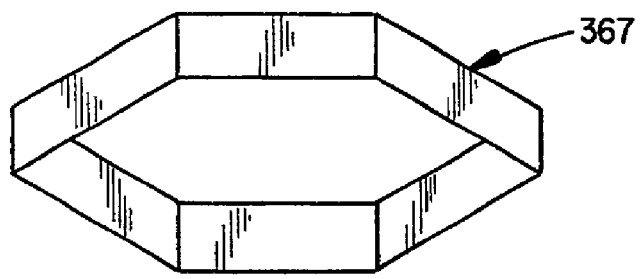

The combination of units with integral supports (self-supporting) and baseless units that may combine with attachable bases, together with the use of interchangeable in-line and hinged pivoting connecting devices allows multiple unit systems to be configured and reconfigured in almost any arrangement imaginable. Several of these are depicted in the FIGS. 25A–25F. The compact closed triangle structure 354 in FIG. 25C is formed by three units without support bases connected by hinged fittings to form a unitary structure. The swept-back structure 356 of FIG. 25A may or may not have snap-on or integral bases. FIG. 25B shows a linear system that combines units with triangular bases 348 with a connected base-free unit. FIG. 25D shows yet another possible in-line combination at 358. FIGS. 25E and 25F depict still another arrangement or structural booth-type concept. FIGS. 25E and 25F include an integrally snap connected forward angled top panel unit 361 that provides a closed overhead booth look. This structure will often be adorned by a top horizontal front header banner or other device not shown. FIG. 25F is similar to FIG. 25E but includes additional flanking units 262 and 263.

The FIGS. 26A–26D illustrate a plurality of polygon arrangements at 364–367 in which the units are connected end to end. In these arrangements, consecutive mounting rods or members may be connected as by fittings such as shown in 27E.

It will be recognized that the versatility of the system concept enables one to mount and configure multi-banner or mural arrangements in almost any shape. The multiple murals or banners can together depict one large scene or a plurality of smaller graphics. Those extending in multiple directions, of course, can also show the same or different graphics to be viewed from the several directions.

FIGS. 27A–27M depict typical fittings for use with the systems, including but not limited to, hubs and hinged or rotating connecting devices and straight or in-line connecting devices useful for the assembly of many multiple unit system configurations. FIGS. 27A–27C depict hinged connectors typically capable of at least 240° of rotation and FIG. 27E depicts a rotating connector with full (360°) rotation so that it may be used as a Uconnector. FIG. 27D depicts an end cap for insertion in the last mounting rod end in any sequence. In these figures, a press fit end hub is shown at 370 having an end 372 adapted to fit into one end of a top or bottom mounting rod (not shown) and which may be attached to another end hub at the opposite end of the mounting rod by a resilient bungee cord device or the like in a manner as previously described. The opposite end of the end hubs 370 includes an enlarged knob 374 designed for snap fitting into sockets of similar shape as illustrated at 376 in the figures to be removably snap fit and held in place by shoulder 378. The end hubs 370 also typically include locking hub bores 380 designed to cooperate with the end hubs of X-brace cross members in a manner previously described with reference to FIGS. 16A and 16B.

The FIGS. 27A–27C illustrate press-fit, hinged locking sleeves which include mutually relatively rotating, hinged parts 384 or 384A and 386 which also pop apart if desired. Part 384 includes a hub 385 and hinge pin rivet 388 onto which part 386 is pressed or snaps held by pin hub 389. In FIG. 27C, there is depicted several angles of rotation in phantom. These include a 60° (120° from linear) angle necessary for the three unit equilateral triangle set up of FIG. 25C and 90° useful for rectangular or wing back configurations. Of course, any angle within the allowable pivoting arc is available. Integrally molded stops on one section of the press fit device can be used to limit rotational travel. The end cap of FIG. 27D is illustrated at 390. As previously indicated, FIG. 27E depicts another rotating connector which fully rotates and can be configured in the form of a press fit U-connector 420 for joining adjacent parallel mounting members as in the consecutive end-to-end polygon arrangements of FIGS. 26A–26D. Even this connector is a press fit or snap-together system in which identical parts 422, each containing an end hub receiving recess and locking recess 424, themselves include pivots 426 which carry the numbers 422 in common block 428. This fitting is adapted to connect consecutive mounting members fragments of which are illustrated at 430.

Figure 27F:
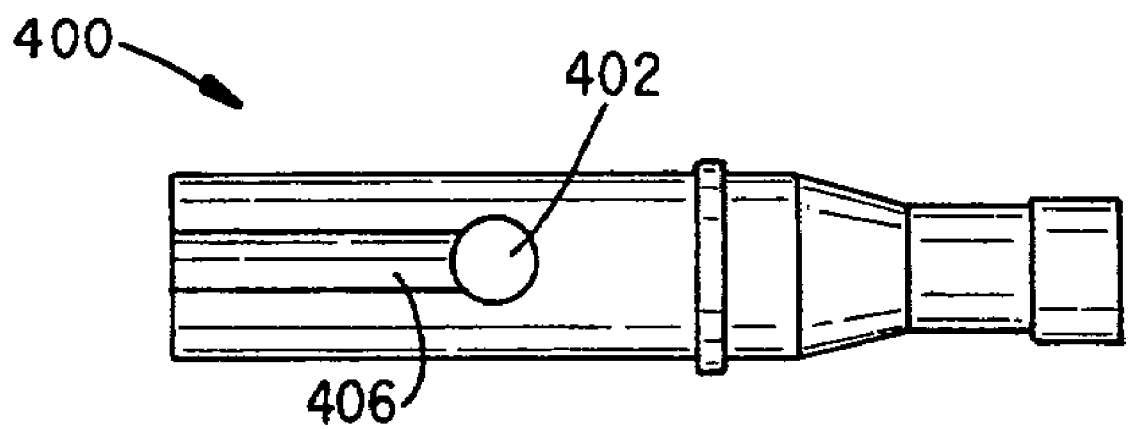
Figure 27G:
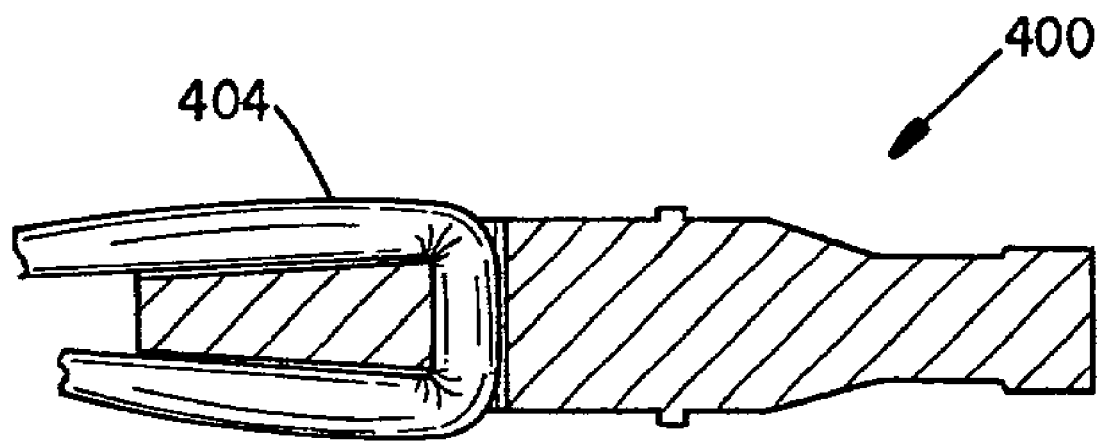

FIGS. 27F and 27G illustrate one end tip or end hub/bungee arrangement. The end hub 400 includes a bore 402 adapted to receive one end of a bungee cord 404 shown in cut away in FIG. 27G and which cooperates with opposed wedge slots 406 to wedge-trap and fix or trap the end of the cord 404 when the hub 400 is inserted in a tube member of appropriate size.

Figure 27H:
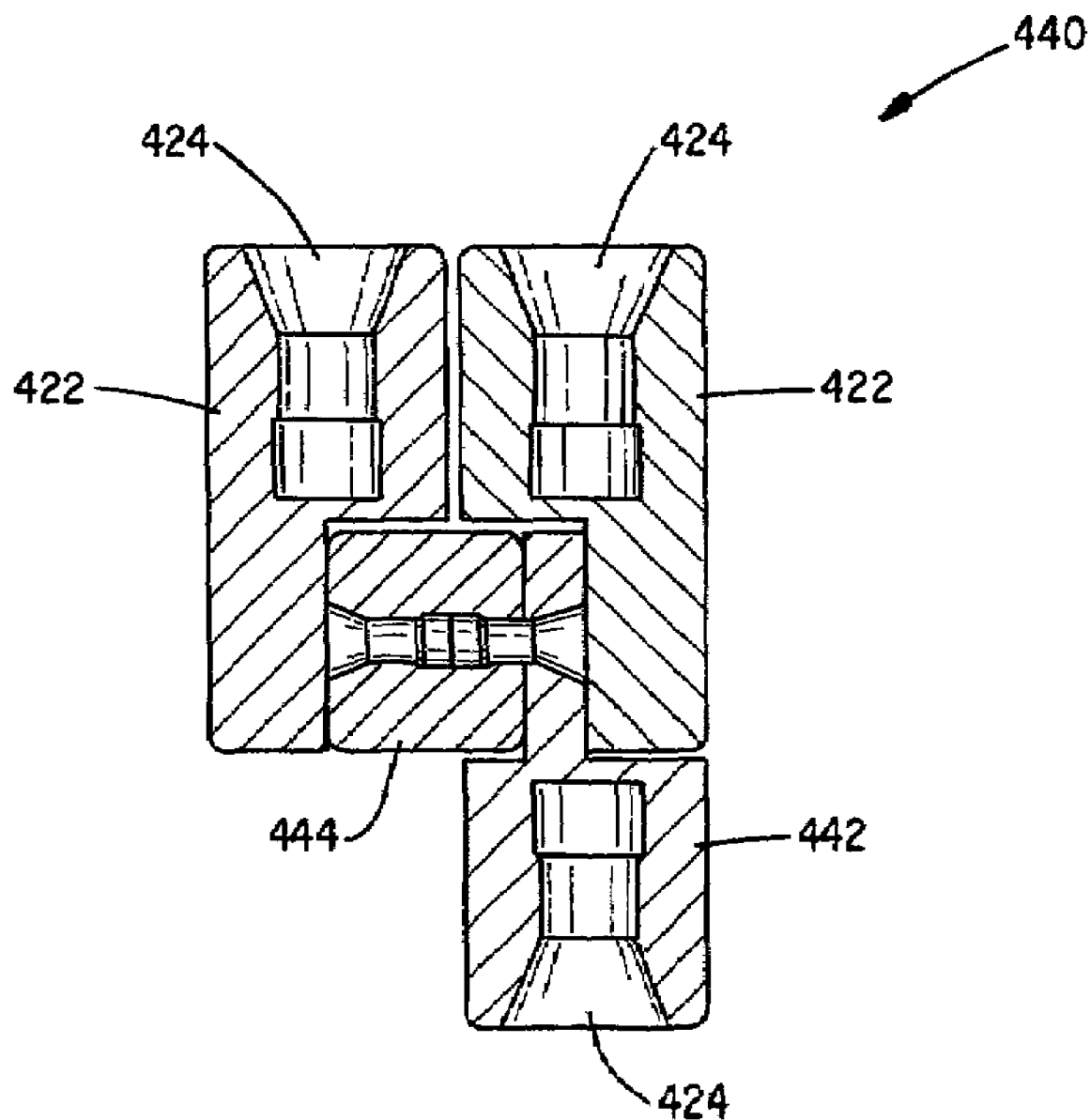
Figure 27J:
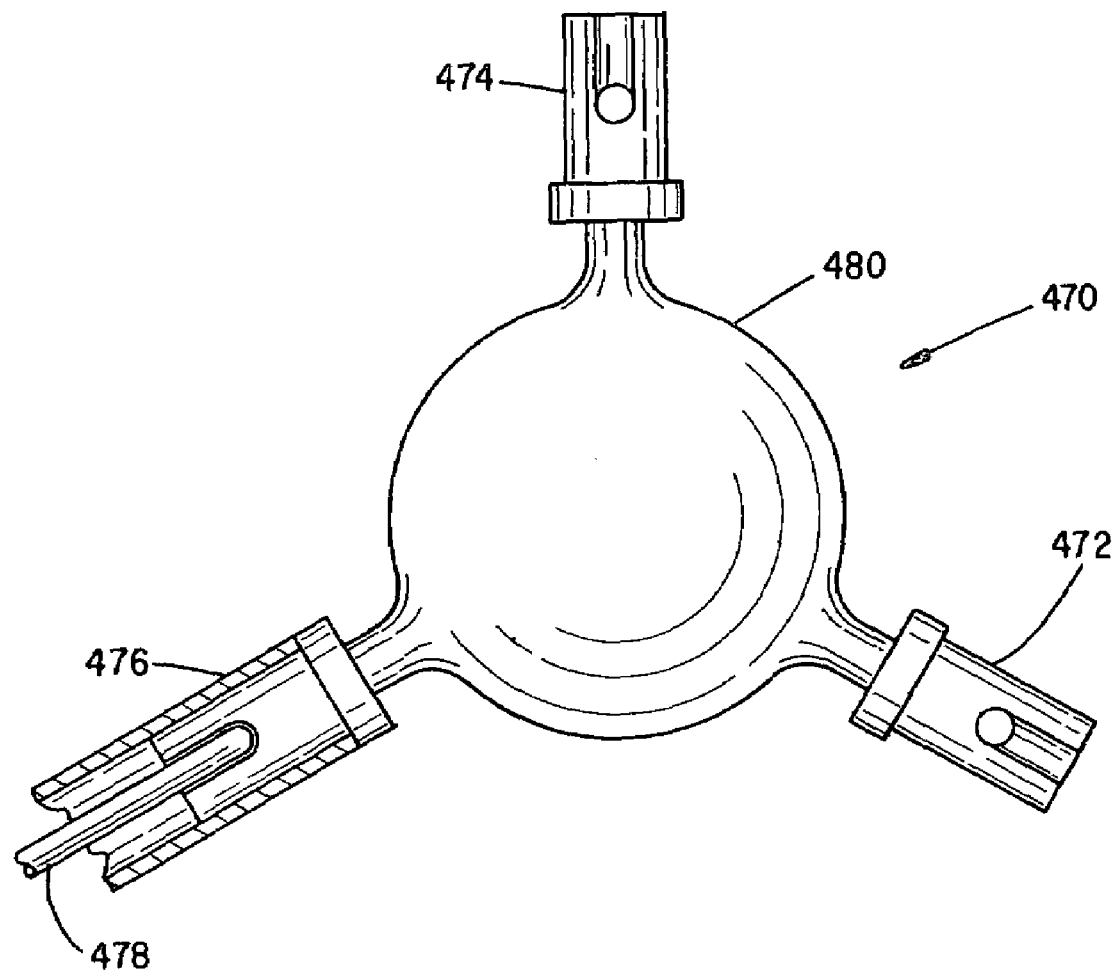

The FIG. 27H depicts yet another composite press-assembled connector at 440 which provides for an additional snap-in recess-containing rotating member 442 connected to provide a modified version of the concept of FIG. 27E using a common connector base 444. The components of these devices also can be separated and re-press fit together as desired.

Figure 27K:
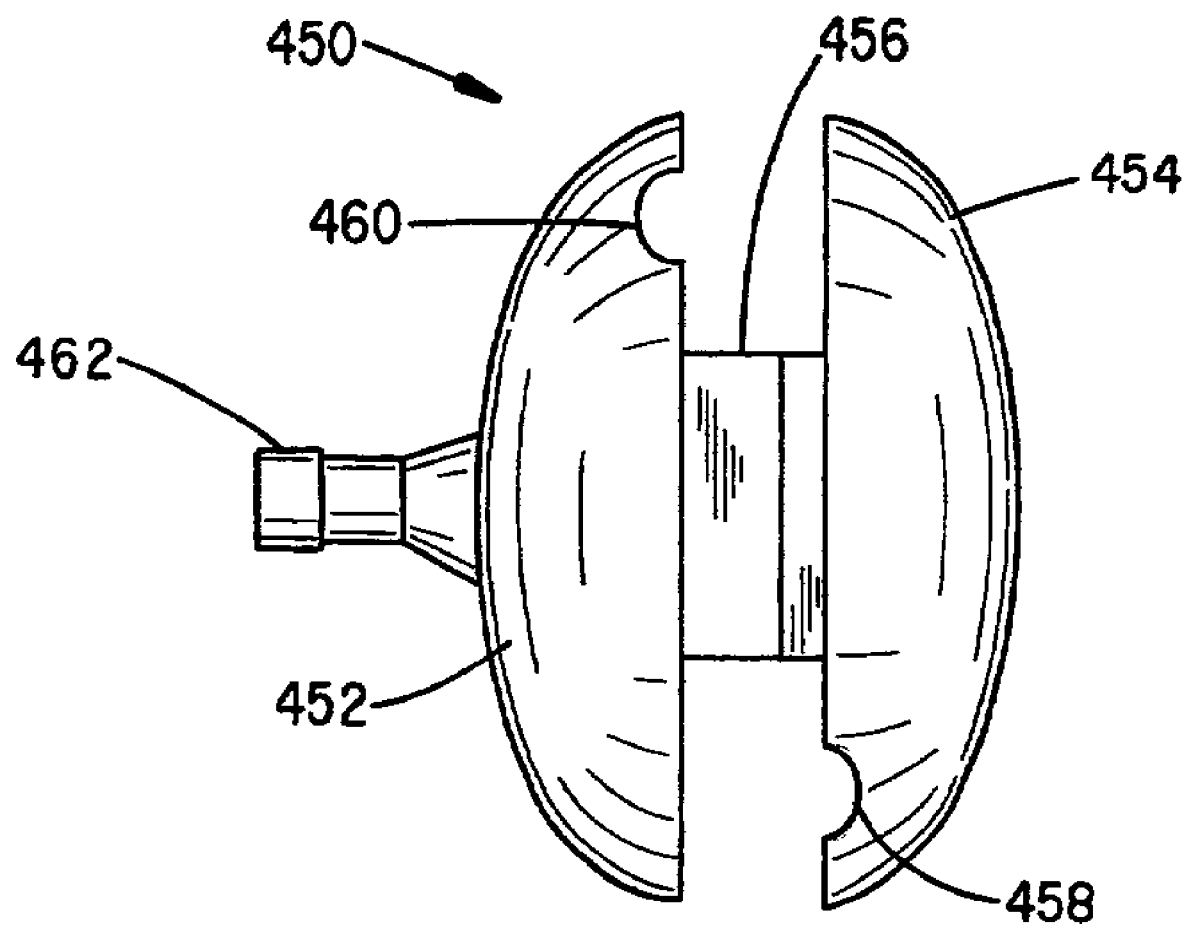
Figure 27L:
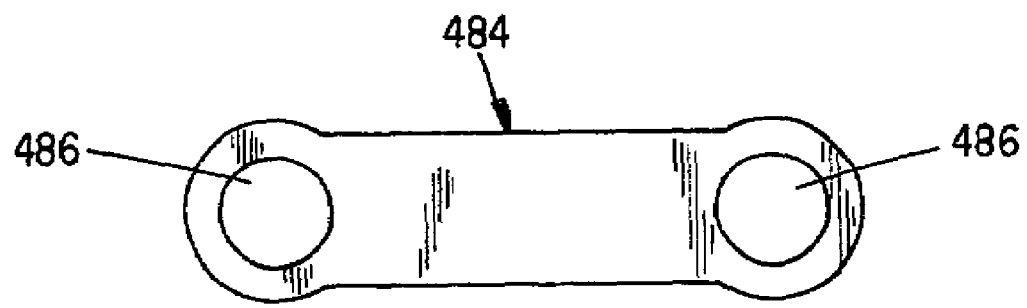
Figure 27M:
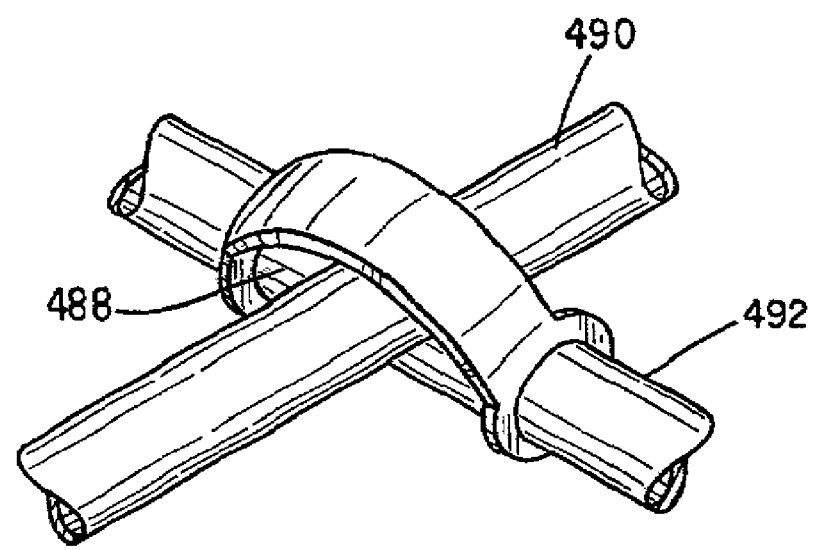

FIG. 27K depicts a removable snap-together or press fitting, snap-on hub arrangement 450 designed to retain the X-brace members at the intersection thereof in the manner of the strap 66 in FIG. 1, or FIGS. 27L–27M, including snap-together or press fit segments or halves 452 and 454 joined by snap connector 456. Recesses 458 and 460 are provided to accommodate the X-brace struts of any of the embodiments. Optionally, a further connector 462 may be provided to connect at right angles to a vertical strut (as at 584 in FIG. 31) of a removable base unit discussed below in conjunction with FIG. 31. Of course, this device, like the others while when press fit or snapped together will remain in place indefinitely, is designed to be popped open and removed in accordance with the knock-down rearrangeable design concept of all of these configurations.

FIG. 27J depicts a flexible 3-way connector 470, including 3 connecting devices 472, 474 and 476 which may be male or female connectors and are illustrated as female connectors for use with bungee cords as at 478, but can include cordless recesses as previously shown 424. The connectors are connected to a central hub 480 and may connect to a vertical and two horizontal or coplaner members via cords or snap fitting to provide a support base. It will be recognized that both the displays and the display fittings that join them together are designed to the extent feasible to snap together and come apart as needed. This device can be used in conjunction with the hub of FIG. 27K in the construction of the removable base support unit as discussed below in conjunction with FIG. 31.

FIGS. 27L and 27M depict an alternative system for retaining the X-brace members in stable configuration in which a flexible strap 484 having bores 486 for receiving an X-brace tube is assembled on the member 492 so as to form a loop 488 to contain the crossing member 490 as shown.

The fittings illustrated just above, like those previously described, may be fabricated from lightweight aluminum alloy, formable polymeric materials, fiberglass or any other suitable materials. Those illustrated in FIGS. 27A–27M are preferably extruded or cast from any of a variety of polyamide materials, particularly nylons, however, any suitable, dimensionally stable and functional material will do.

Figure 29:
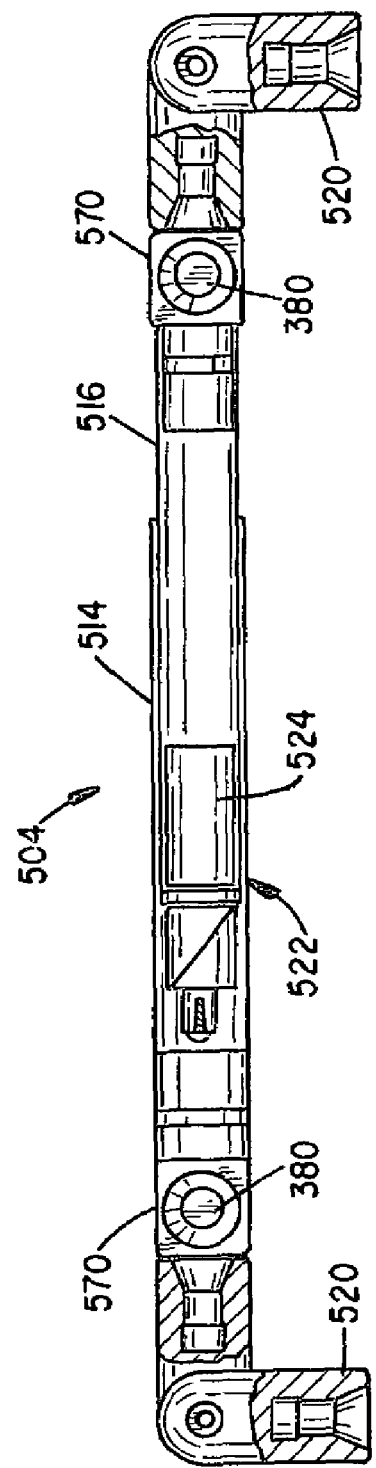
FIG. 29 depicts one size or length of a mounting tube having an adjustable length.
Figure 30A:
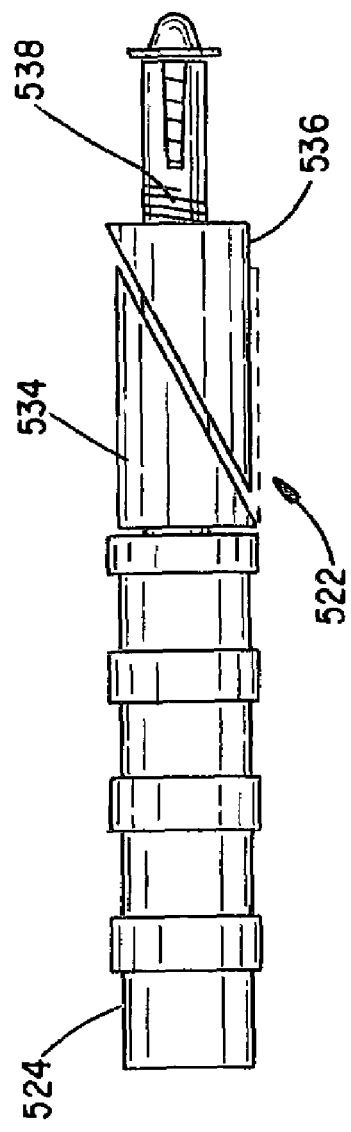
FIGS. 30A–30E further illustrate a locking mechanism for the adjustable lengths and several bungee or resilient cord attachment alternative arrangements.
Figures 30B, 30C:
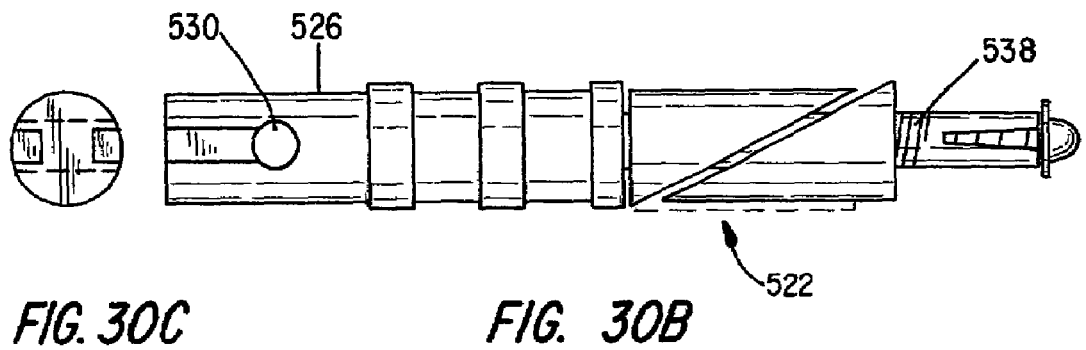
Figures 30D, 30E:
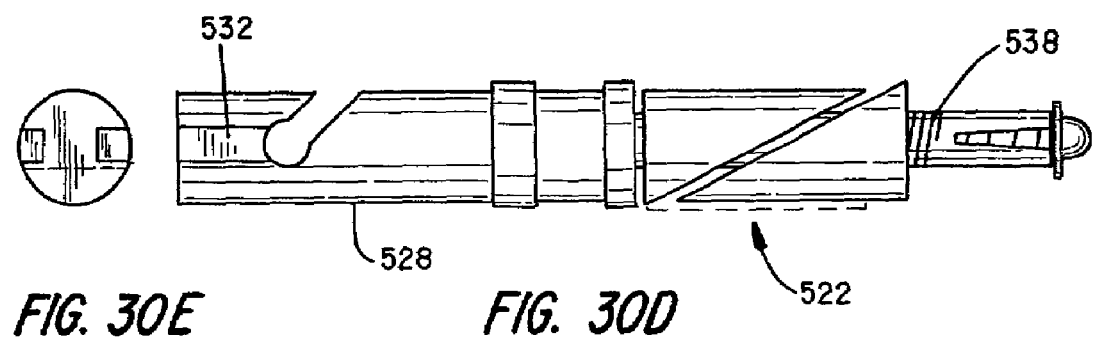

An important aspect of the present invention is the provision of a light weight knock-down or collapsible display system of the class described, but which itself is capable of assuming a variety of sizes. In embodiments of this system, both the mounting rods and the cross or Xbrace legs or rods can be constructed to be extended and collapsed to provide a variety of display system sizes by accommodating a variety of banner and mural sizes. Components of systems illustrating this concept are depicted in FIGS. 28A–28B, 29 and 30A–30E. FIGS. 28A and 28B show two different sizes of extendable X-brace rods 500 and 502, respectively, while FIG. 29 depicts one size of mounting rod 504 in which the details are enlarged.

As seen in FIGS. 28A and 28B, each of the X-brace legs or rods includes a plurality of rod segments including a pair of telescoping segments 506 and 508 and end segment 510 and one or more intermediate segments 512. Note that the device of FIG. 28B contains one additional segment 512 to enable it to extend beyond the length of the rod in FIG. 28A. The mounting rod of FIG. 29 shows only a pair of telescoping rods 514 and 516. It will be appreciated that these also can be of varying lengths. The rods of FIGS. 28A and 28B further include pairs of end hubs 518 and internal bungee cord as at 520. The system of FIG. 29 further includes press fit end hubs 370 as previously described including locking hub bores 380 which are designed to accommodate the hubs 518 in the X-brace devices in a locking manner as previously described. Hinged connectors are also shown at 520.

A locking mechanism for the telescoping tubes depicted generally by 522 in mounting tube 504 is best shown in the enlarged views of FIGS. 29, FIG. 30A, 30B and 30D. It includes a press fit hub section 524, 526 or 528, with hubs 526 and 528 showing different configurations at 530 and 532, respectively, to accommodate resilient bungee cord devices (not shown) in multiplesectioned models.

The locking devices themselves include a pair of relatively movable wedges in the form of a fixed wedge 534 and a movable wedge 536 which has a central bore threadably mounted on a screw device 538, which extends into the member 534. Thus, by rotating the members 506, 508 or 514, 516 relative to each other the wedges slide past each other expanding to lock against the interior of the tubes and reducing the relative size of the configuration of the wedges 534 and 536 to unlock the tubes in any desired telescoped position. The amount of permitted relative elongation of the system is, of course, governed by the relative length of the tube sections 506, 508 and 514, 516. This is typically from about 12 inches (25.4 cm) to about 24 inches (50.8 cm), but can be any desired amount.

Figure 31:
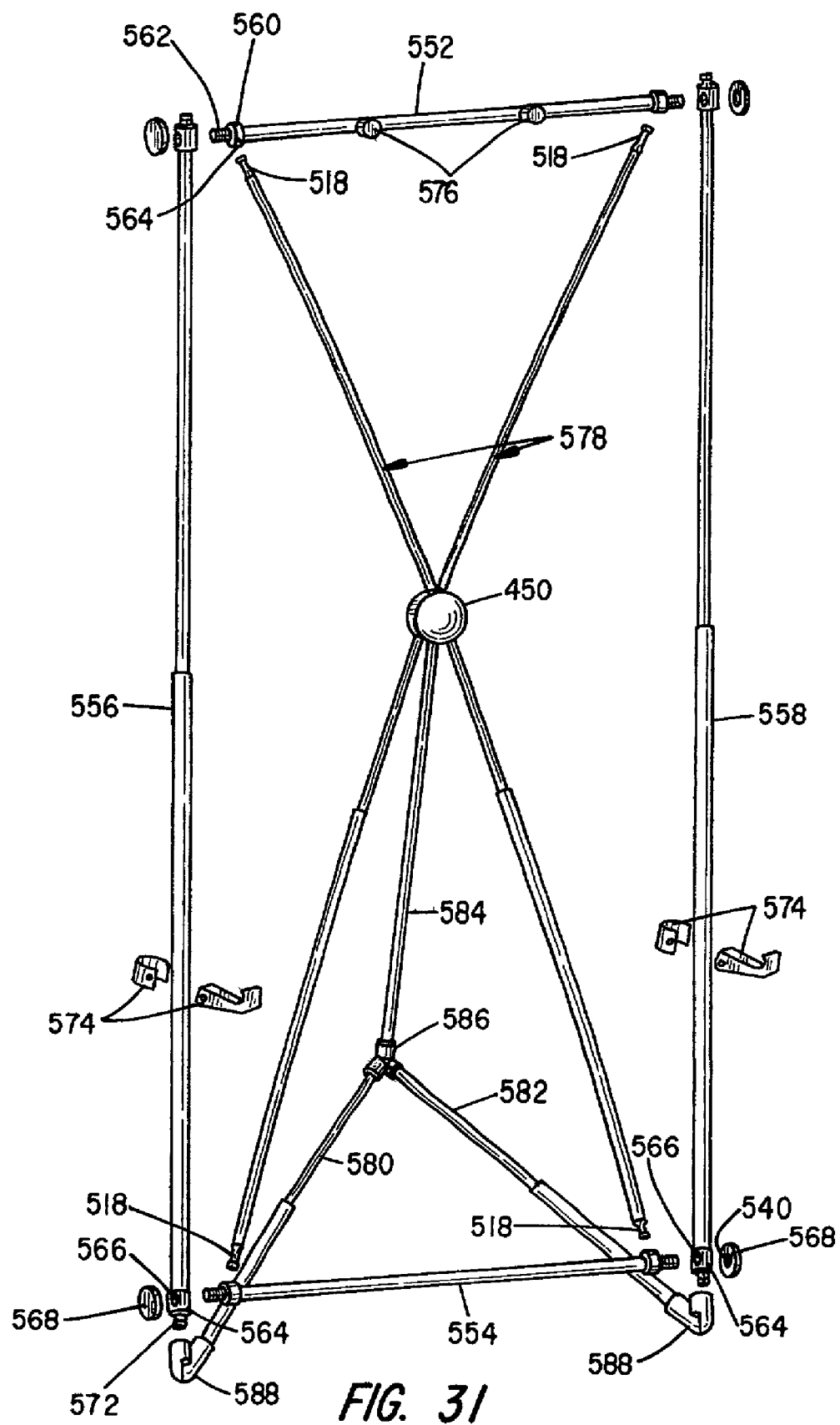
FIG. 31 depicts a perspective view of an easel having a telescoping construction and illustrating a removable triangular base support.

Still other telescoping embodiments, or embodiments which can optionally be made size variable, are depicted in FIGS. 31, 32A and 32B. FIG. 31 depicts an optionally self-supporting structure of variable size 550 there shown configured as a work supporting easel and including top and bottom transverse members 552 and 554 which may also be constructed to be length adjustable and telescoping although not shown so in the drawing and telescoping side members 556 and 558 which join as described hereafter to form a quadrilateral structure. The transverse members 552 and 554 are provided with removable press-fit hub members 560 which of threaded expose shafts 562 and openings for locking end hubs 518, as has been described. The side members 556 and 558 also are provided with press-fit hubs 564 having bores 566 designed to accommodate the threaded shafts 562 of the hubs 560 and nurled finger-tightenable knobs 568 with threaded bore shafts 570 are provided to complete the four-corner connections. The hubs 564 are also provided with snap-fitting knobs 572. The easel also has lower supports or work holders 574 which attach as two parts to be secured around the members 556 and 558. Upper work retainers are depicted at 576 attached to the member 552.

Telescoping X-braces or struts 578 are also provided and held in place at their intersection by a snap-together hub such as that previously described at 450 which also connects to a support base formed by telescoping members 580 and 582 via a telescoping strut member 584. The three members are preferably joined at 586 by a flexible 3-way connector as previously described with reference to FIG. 27J at 470 and members 580 and 582 also snap fit connect to the hubs 564 via rotating connectors 588 which may be the same as or similar to those shown in FIGS. 27A–27C. The remaining or top end of the strut 584 connects into the snap-on hub 450 using a connector such as that shown at 472 in FIG. 27J. Once assembled, the easel provides a rigid support structure for carrying fairly heavy work loads but is one which can also be readily disassembled as desired.

FIGS. 32A and 32B depict an A-frame-type system 600 with a mural or banner shown mounted over the A-frame in FIG. 31B at 602. The system itself includes a quadrilateral base having parallel members 604 and 606 spaced by connected cross members 608 and 610. These are joined together by snap-fit hubs, previously described, which enable the assembly of a stable quadrilateral base structure. Central hubs 612 and 614 are provided with one or more spaced bores 616 to accommodate the end hubs of X-brace cross members 618 and 621 which may be telescoping in nature. The X-brace or strut members also connect, as previously described, to the end hubs 620 and 622 of a top mounting member 624 and the length thereof is adjusted to hold the mural or banner 602 taunt between the members 604, 606 and 624. The inner section of the cross braces or X-braces 618 and 621 may be provided with either a strap or a snap-fit hub as previously described (not shown).

It is an important aspect of the invention that the versatility of the systems described be recognized. Thus, the various knock-down structures can be reassembled in the same or other ways to produce a variety of final structures of numerous sizes to accommodate a wide array of graphic materials. Hubs and associated connectors are fully interchangeable. The triangle stand base, for example, is also made to be readily added or detached as necessary from certain of the banner-carrying or mural-carrying single units.

Additional embodiments of knock-down lightweight display supports are illustrated in FIGS. 33–36 in which the triangular base arrangement such as shown in FIGS. 13A–13C and 25A–25F may be replaced with a stabilizing tripod leg arrangement in snap-fit integral combination with an X-braced banner support configuration characterized by a central hub member which may be in the form of an X-shape which serves to retain both the cross braces and a pivotal tripod leg in an adjustable relation which conveniently allows the banner display system to be self-supporting either in a vertical or horizontal disposition. This simplified system further readily enables snap-fitting, back-to-back and wall mount versions by substituting a double-ended connector for the tripod leg connector device. Side-to-side and other multiple banner arrangements using connector devices previously discussed as in regard to FIGS. 16A–B, 22A–B and 27A–H and telescoping members such as shown in FIGS. 28A–B, 29 and 30A–E may also be used.

Figure 34:
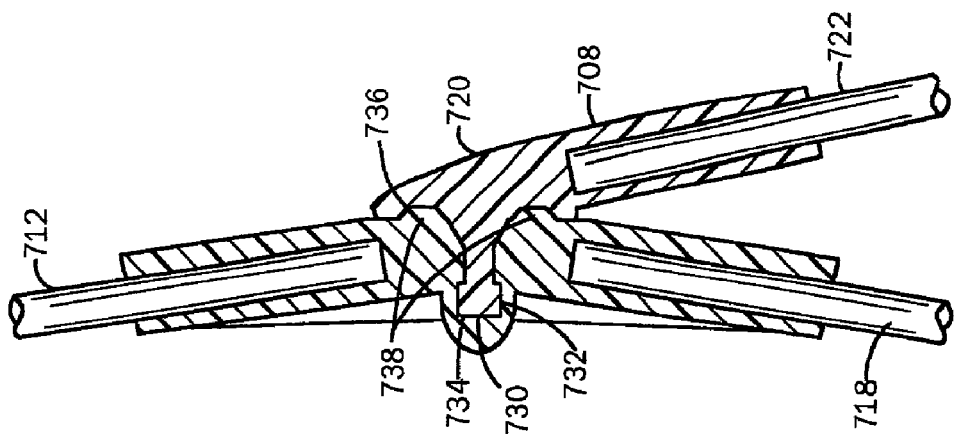
FIG. 34 is a side view of the central X-member hub of FIG. 33.

The core of this arrangement is a central hub system, one embodiment of which is shown generally at 700 (FIG. 33) which includes a main unitary molded central hub 702 provided with diverging integral leg-receiving recesses 704, 706, 708 and 710 which combine to form a distinctive "X" pattern shown carrying respective brace members in slip-fit arrangement depicted by fragments 712, 714, 716 and 718 which represent X-brace members or struts which may be similar to those depicted at 578 in FIG. 31, for example. A further snap-fit leg pivoting and rotating member 720 seen better in FIG. 34 is provided which carries an additional stabilizing or tripod leg 722 that slips into recess 724. The leg 722 forms a back stabilizing or a rear tripod leg with the two adjacent brace members. The member 720 with leg 722 is capable of swiveling between a vertical and horizontal disposition so that the "X" form can be used in either disposition. The system provides the tripod base support without the need for horizontal segments such as at 580 and 582 in FIG. 31.

Figure 33:
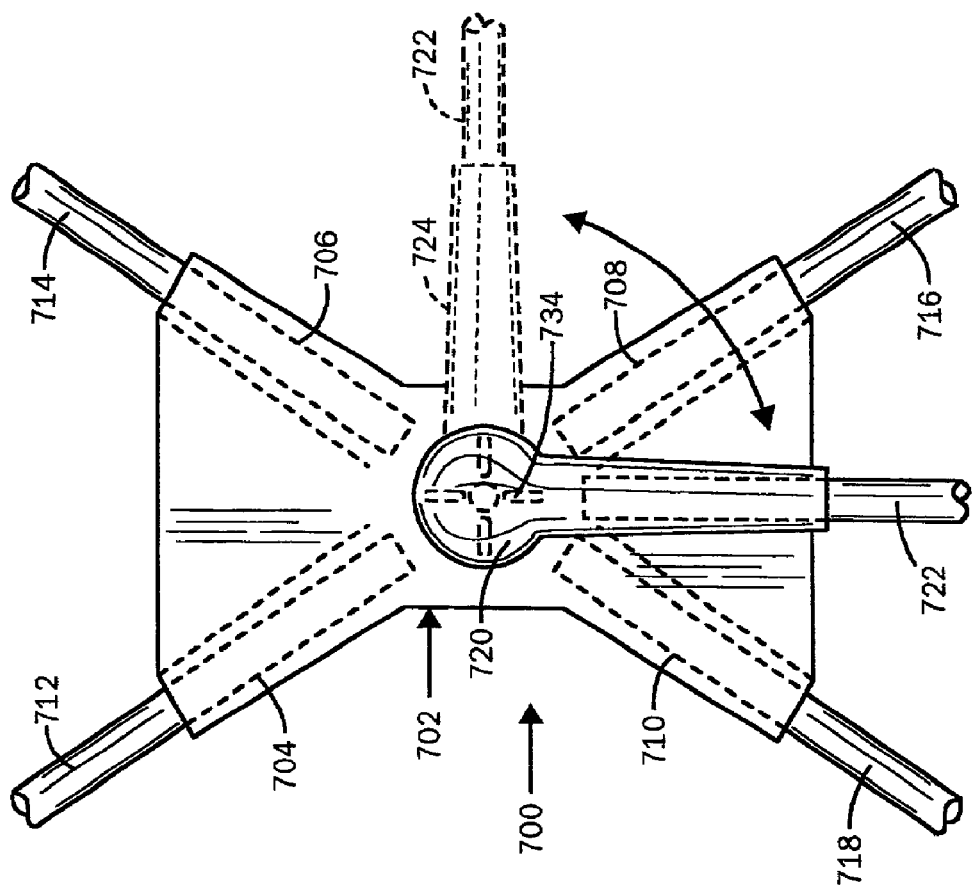
FIG. 33 is a rear view of a central hub member with fragmentary braces attached for use with a tripod leg support arrangement of a banner display system in accordance with the invention showing dual leg positions.

A side view of the system of FIG. 33 is shown in FIG. 34 which includes a snap fitting, knobbed integral connector 730 which has a knob 732 snap fit into a similar recess 734 in the member 702. The connector member 730 is shaped similar to that depicted at 374 in FIGS. 27A–27E and is retained but freely pivots or rotates in the recess 734 so that the member 720 with inserted tripod support leg 722 can pivot between a vertical and horizontal disposition to display a corresponding mounted banner. The selected position is maintained by the interaction between a shaped recess 736 in the member 702 arranged in a pattern such as a cross which coincides with a pattern of raised area 738 in the member 720. These snap into position to support predetermined radial locations such as every 90°.

Figure 36:
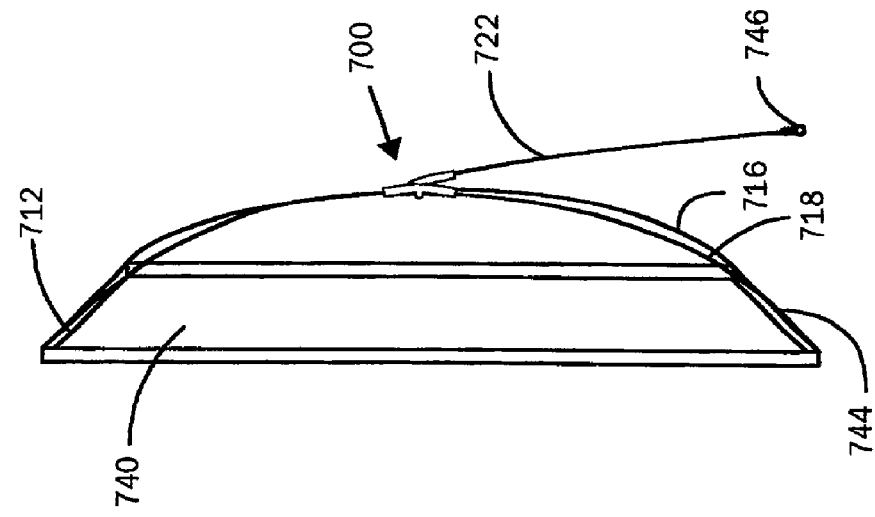
FIG. 36 is a side view of the banner display system of FIG. 35.
Figure 35:
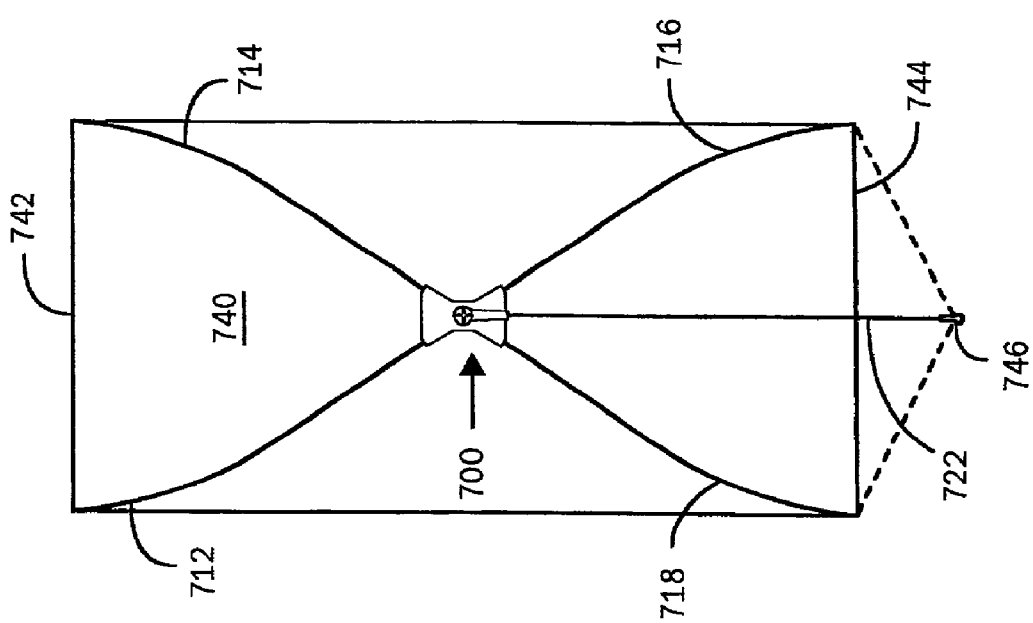
FIG. 35 is a rear view of a banner display system utilizing the central hub member of FIGS. 33 and 34.

The central hub system 700 in FIGS. 33 and 34 is shown as part of a self-supporting banner display support system in FIGS. 35 and 36. As can be seen in those figures, the X-brace members or struts 712, 714, 716 and 718 may further be curved as desired. Mounting rods are shown at 742 and 744 and a banner is shown at 740. Three point stability is provided by the leg 722 with foot 746.

Figure 42:
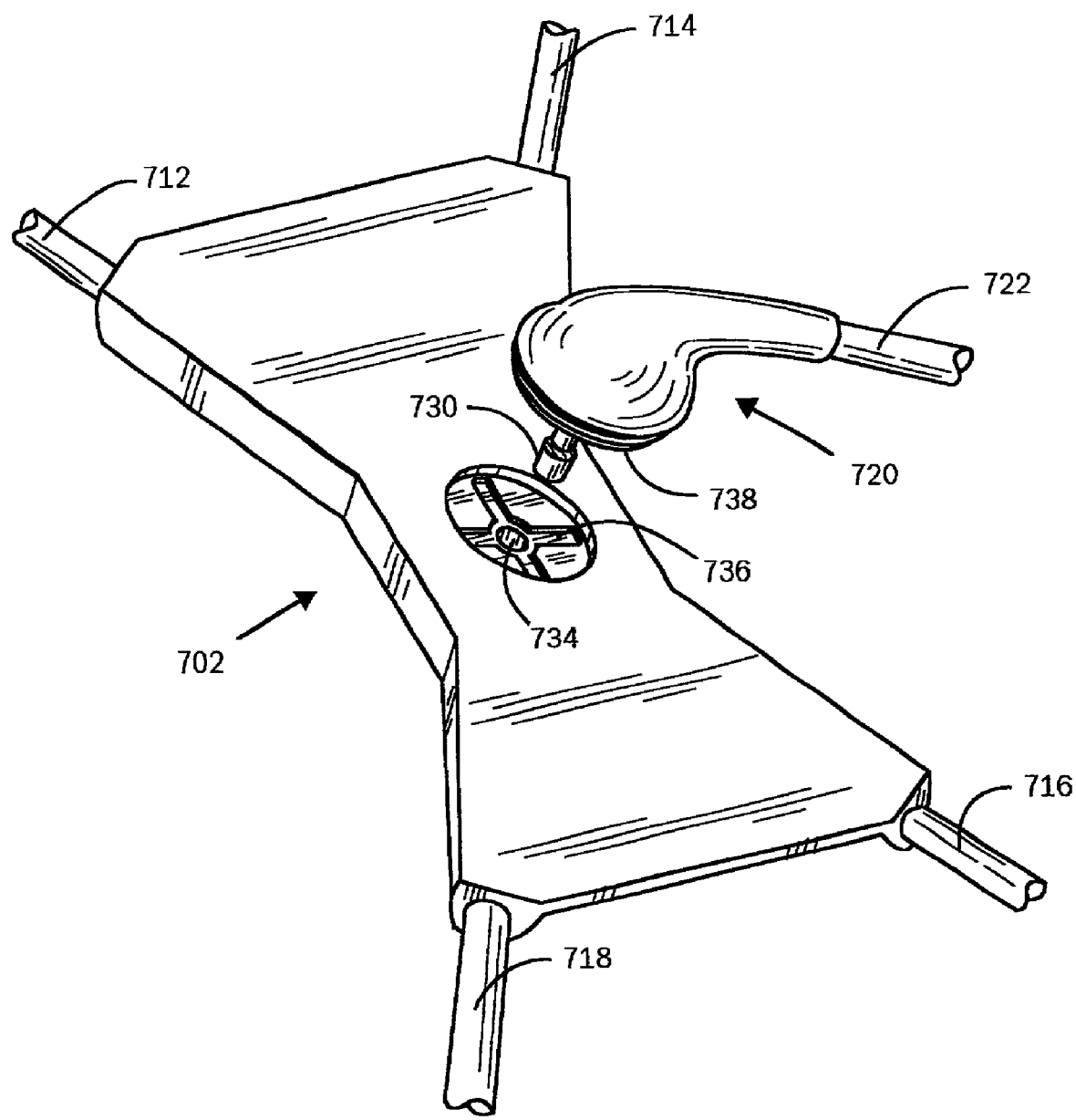
FIG. 42 is a partially blown apart fragmentary view of a central hub member and a connecting stabilizing leg as shown in FIGS. 34–36.

FIG. 42 depicts an exploded perspective view of the assembly of the snap fitting stabilizing leg pivoting and rotating member 720 into the X-member 702. This illustrates a 90° rotate/fixed position system with the recesses 736 and raised area 738.

Figure 38:
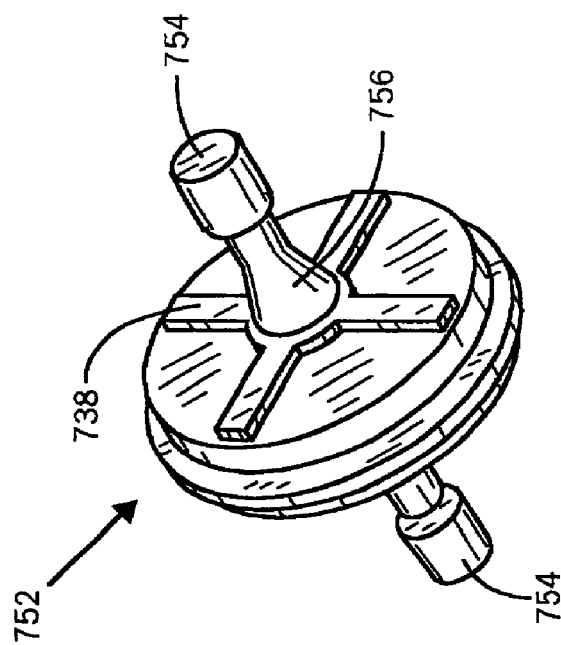
FIG. 38 is an enlarged perspective view of the double connector of FIG. 37.
Figure 37:
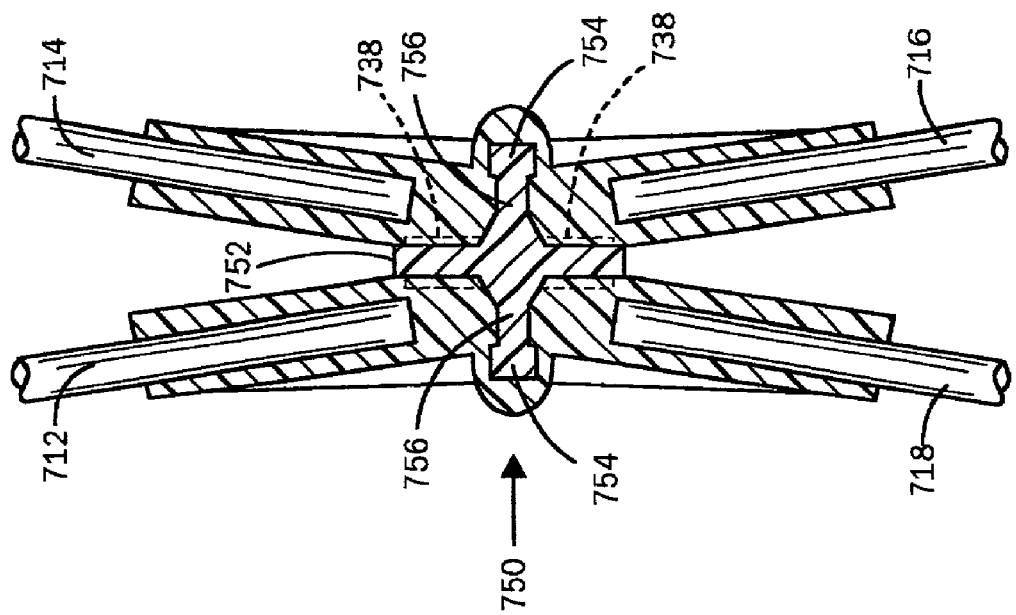
FIG. 37 is a fragmentary view showing locking system for a back-to-back arrangement using two central X-members.

FIG. 37 shows a back-to-back double banner display 750 in which two central hub member connected systems are fastened together using a snap-in double ended connector 752 (see also FIG. 38) replacing the single ended connector system 730 in FIG. 34 to fasten two display systems together in back-to-back arrangement obviating the need for a stabilizing tripod leg for either.

Figure 39A:
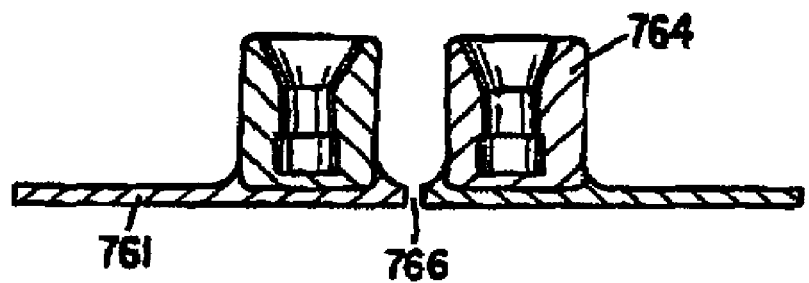
FIGS. 39A and 39B illustrate a wall fastening arrangement such as that utilized in FIG. 40.
Figure 39B:
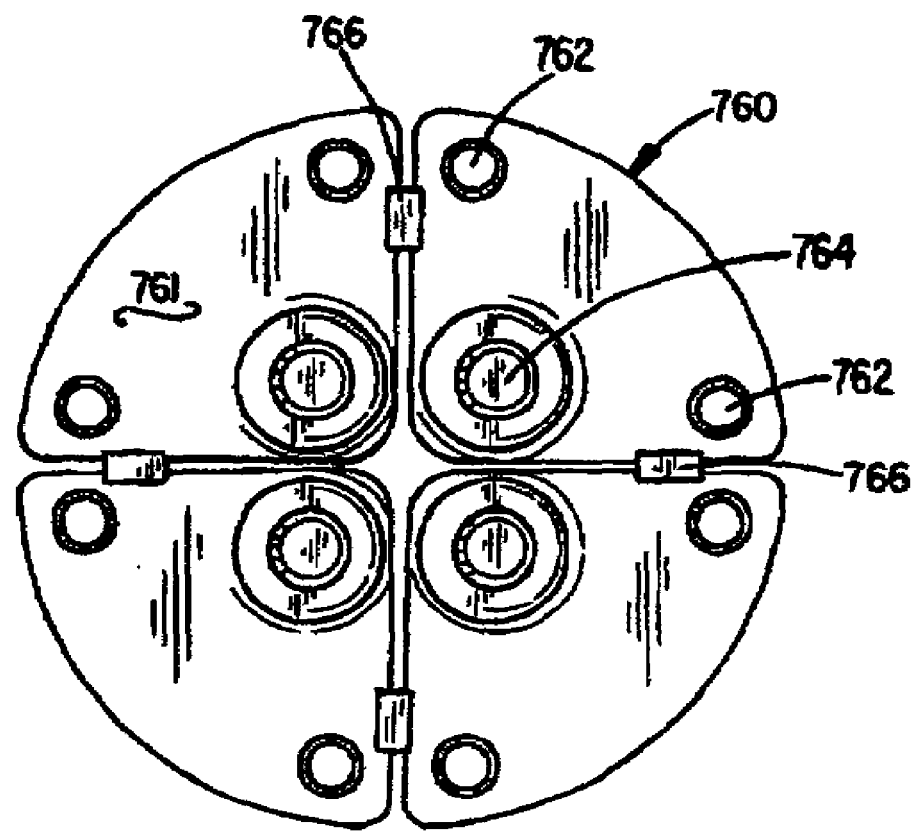
Figure 40:
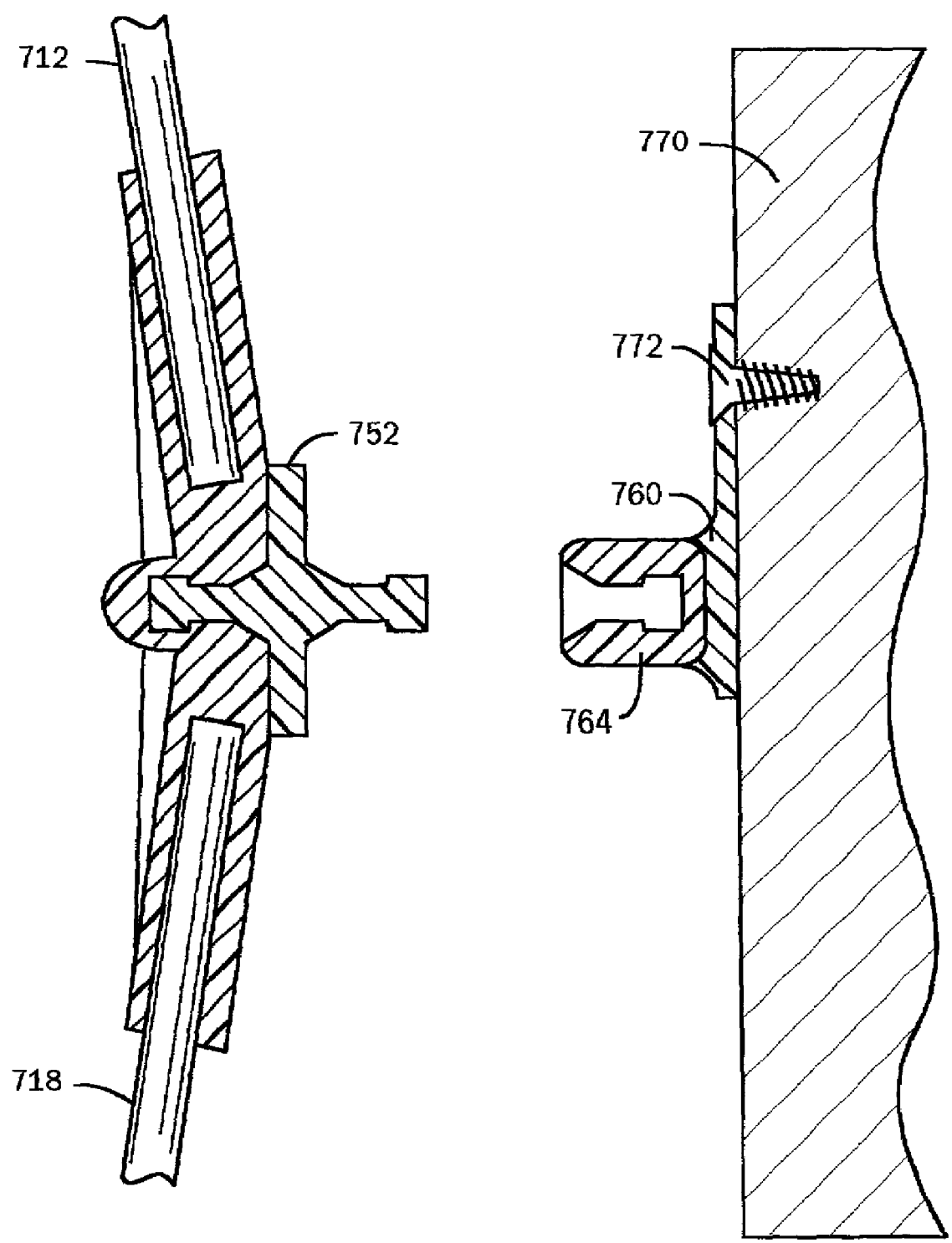
FIG. 40 is a fragmentary exploded view illustrating an arrangement in which the display system is fastened in a snap-fit arrangement to a wall.

The snap-in double connector 752 can also be used to fasten a single display system to a wall or the like as shown in the blown apart view of FIG. 40. This arrangement uses a wall securing feature shown in greater detail in the exploded views of FIGS. 39A and 39B. FIG. 39B illustrates a plurality of fastening segments 760, in having a base 761 including holes 762 which may be countersunk for use in securing each segment to a wall or other mounting area. Each segment also features an integral snap-in receptor 764 shown better in FIG. 39A and the segments are designed to break apart from a larger multi-segment system as at 766. One segment is shown mounted to a wall fragment 770 using wall fasteners as at 772 in FIG. 38.

Figure 41:
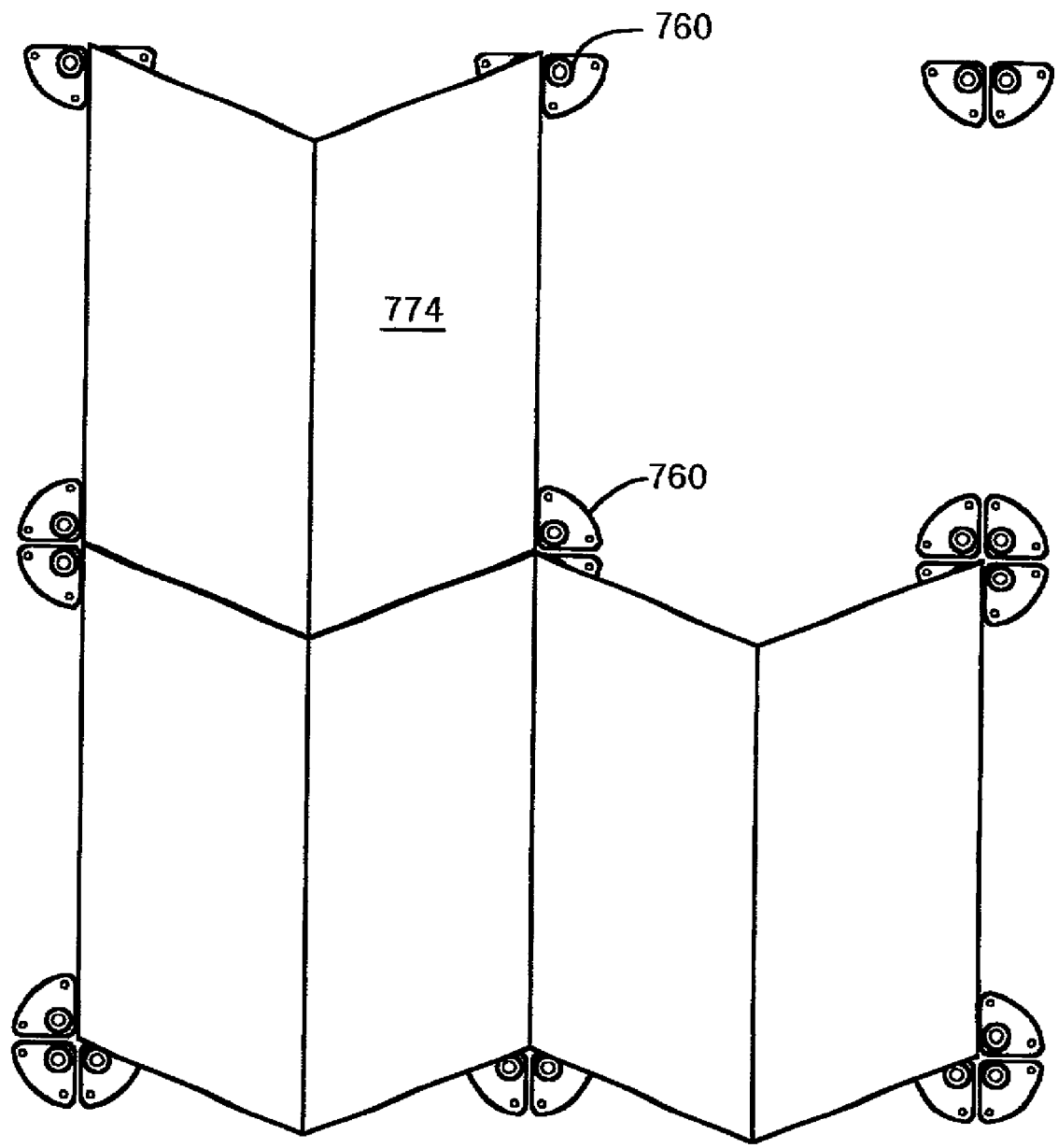
FIG. 41 depicts a schematic view of the wall fastening system of FIG. 40 as used to connect a multi-faceted conglomerate display to walls and floor.

As shown in FIG. 41, the fastening segments can be used to fasten multiple displays as at 774 both to walls and floors. Any of the compatible snap-fitting knob and shank connectors illustrated in previous figures and embodiments can be used in this manner to fasten units together and to walls, floors or even ceilings. As can be seen, the extent and shapes of such an exhibit have almost endless possibilities.

Figures 43A, 43B, 43C, 43D:
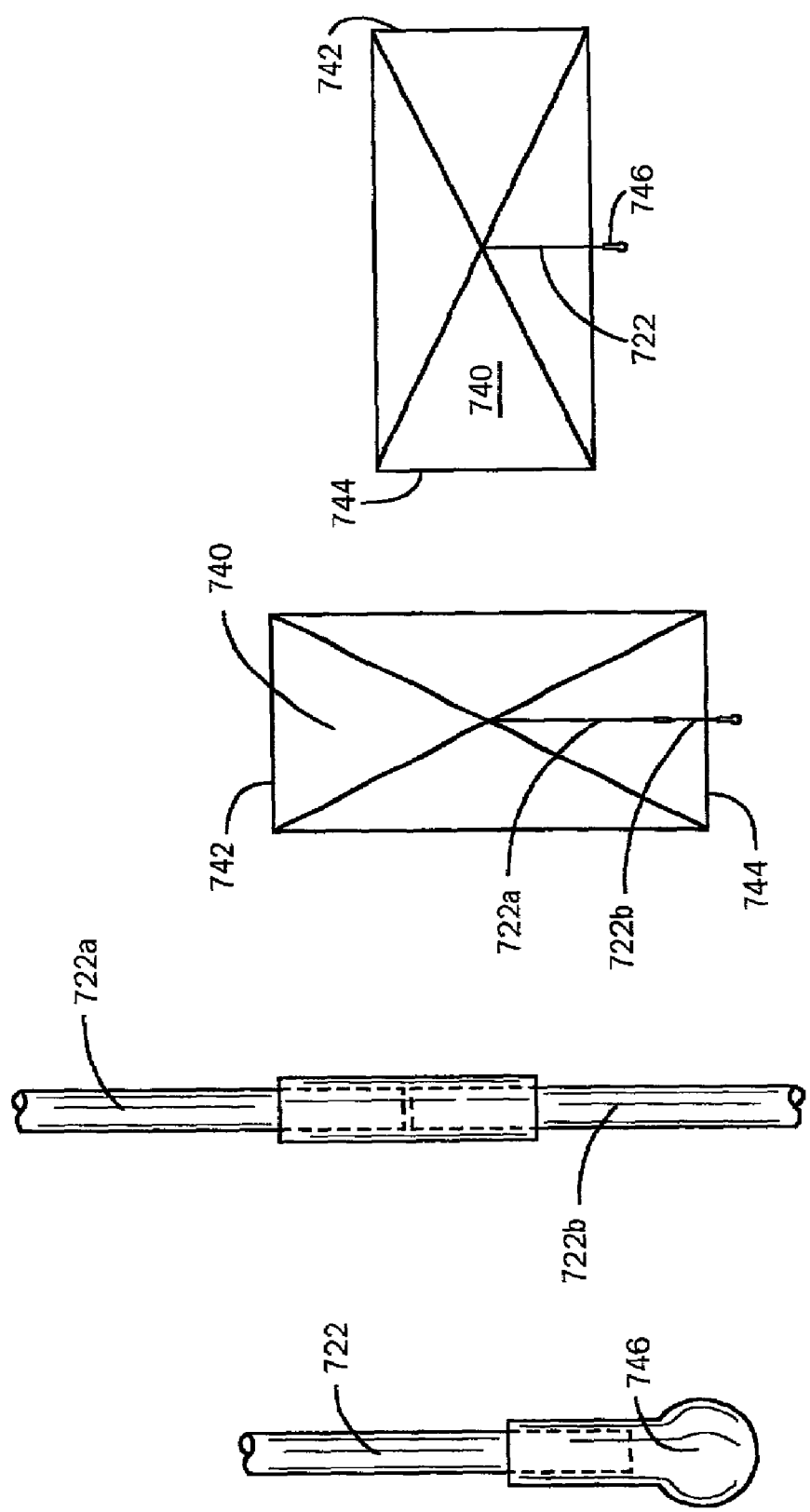

Enlarged view 43A depicts a foot 746 provided for the tripod leg 722 and the tripod leg itself may be any desirable length as shown as multi segmented in FIG. 43B to adjust the height of the vertical or horizontal display. Thus, segments as shown at 722A and 722B may be used. FIGS. 43C and 43D depict vertical and horizontal arrangements schematically.

The arrangements depicted in FIGS. 33 through 40D can be any desired size and also use telescoping parts and the struts and mounting rods may be solid or hollow fabricated of metal such as aluminum alloy, formable polymeric materials or fiberglass depending on the design. The connector and hub members are generally of extruded or cast polyamide materials, particularly nylons, however, any suitable, easily formed and dimensionally stable material may be used.

This invention has been described herein in considerable detail in order to comply with the Patent Statutes and to provide those skilled in the art with the information needed to apply the novel principles and to construct and use embodiments of the example as required. However, it is to be understood that the invention can be carried out by specifically different devices and that various modifications can be accomplished without departing from the scope of the invention itself.

What is claimed is:

1. A readily assembled and disassembled knock-down, self-supporting display unit that extends and retracts to accommodate and display a variety of display devices including banners in a variety of sizes comprising:
   (a) a pair of adjustable telescoping mounting members comprising upper and lower mounting members for carrying opposite ends of the display device, each of said mounting members further comprising at least two relatively movable telescoping members;
   (b) elongate flexible telescoping brace members, each of said brace members further comprising at least two relatively movable telescoping members for connecting to and spacing said pair of mounting members and thereby maintaining a banner carried therebetween in tension, said brace members being designed to form an X pattern;
   (c) a releasable locking device associated with the telescoping members of each said mounting members and said brace members to lock the respective member at a desired length; and
   (d) a central member adapted to retain said telescoping brace members which form therewith an X-brace system.

2. The display unit of claim 1 wherein each of said mounting members further contains:
   (a) a pair of press fit end hubs having hub shank sections of reduced diameter with outer hub sections of a larger diameter such that the hub shanks are received in the end of said mounting members and said outer hubs protrude from the ends thereof;
   (b) said outer hub sections further containing recesses to receive end fittings associated with ends of said brace members; and
   (c) said outer hub sections further containing connection devices adapted to receive snap fit connectors selected from the group consisting of in-line and hinged connectors for assembling multiple display units together.

3. The display unit of claim 1 wherein said brace members comprise a plurality of slip fitting segments and further comprising terminal end fittings at the extreme of said brace members one of said terminal fittings being a pin connected by a resilient cord running between the locking device and several segments to said one of said terminal fittings sequentially capturing said segments therebetween.

4. The display unit of claim 3 wherein a remaining terminal end fitting of each of said brace members is a press fit hub.

5. A readily assembled multi-unit, knock-down, self-supporting snap-fit display stand for displaying a variety of display device including banners comprising a plurality of display units assembled consecutively, each said unit comprising:
   (a) an opposed pair of telescoping mounting members upper and lower mounting members for carrying opposite ends of a display device, each mounting member having an end hub;
   (b) elongate flexible telescoping brace members for connecting to a corresponding opposed pair of mounting members to form a quadrilateral thereby maintaining the banner carried therebetween in tension, said brace members designed to form an X pattern;
   (c) a releasable locking device associated with each one of said mounting members and each one of said brace members to lock each respective member at a desired length;
   (d) integral locking recesses in said hubs for locking said units together; and
   (e) snap fitting connector for removably connecting said ends together to form systems of a plurality of consecutive display units.

6. A readily assembled and disassembled knock-down, self-supporting display unit for carrying a variety of display devices including banners comprising:
   (a) the pair of mounting members for carrying opposite ends of a display banner and a plurality of strut members for spacing said mounting members;
   (b) a central hub member having a plurality of elongated diverging recesses each for receiving an end of one of said plurality of strut members which form therewith an X-brace system and a generally central recess in said central hub member for receiving a snap-in connector having a bore directed away from said strut members;
   (c) wherein said strut members further comprise pairs of elongate flexible brace members having ends adapted to be received in said central hub member and free ends for connecting to and spacing said mounting members and thereby maintaining a display device carried therebetween in tension; and
   (d) a snap-in double ended connector having diverse connector ends including a fixed connector end received in said central recess of said central hub member and a free connector end.

7. A display unit as in claim 6 further comprising a wall mounting device including an integral snap-in receptor for receiving the free connector end of said double-ended connector thereby enabling the fastening of said display unit to a wall.

8. A display unit as in claim 7 wherein said wall mounting device further comprises openings for receiving wall mounting fasteners.

9. A method of fastening a display unit to a fixed member selected from floors, walls and ceilings comprising:
   (a) providing a display unit in accordance with claim 1 having an external snap fit connector;
   (b) providing a mounting device including one or more receptors for receiving said snap-fit connector carried by said display unit;
   (c) providing openings for receiving mounting fasteners; and
   (d) snapping said snap-fit connector into one of said receptors.

10. A method as in claim 9 wherein said one or more receptors of said mounting device hee includes a plurality of receptors for mounting a plurality of display units in juxtaposed relation.

11. A method as in claim 9 wherein said fixed member to which said display unit is fastened is a wall.

12. A method as in claim 10 wherein said fixed member to which said display unit is fastened is a wall.

13. A method as in claim 9 wherein said snap-fit connector is selected from fixed and hinged connectors.

14. A method as in claim 10 wherein said snap-fit connector is selected from fixed and hinged connectors.

15. A method as in claim 11 wherein said snap-fit connector is selected from fixed and hinged connectors.

16. A method as in claim 12 wherein said snap-fit connector is selected from fixed and hinged connectors.

17. A readily assembled and disassembled knockdown, self-supporting display system for carrying a plurality of a variety of display devices including banners comprising:
(a) a plurality of display units, each unit further comprising,
(i) a pair of mounting members for carrying opposite ends of the display device and a plurality of strut members for spacing said mounting members;
(ii) a central member adapted to retain said plurality of strut members which form therewith an X-brace system;
(iii) wherein said strut members further comprise pairs of elongate flexible brace members having ends adapted to be connected to and spacing said mounting members and thereby maintaining a banner carried therebetween in tension;
(b) a mounting system comprising a plurality of snap-fit connectors configured to connect each of said display units to a plurality of snap-fit receptors in fixed wall or floor mounting devices; and
(c) a connecting system comprising a plurality of snap-fit connectors configured to connect a plurality of said units together at a desired angle.

18. A display system as in claim 17 wherein said fixed wall or floor mounting devices further comprise openings for receiving snap-fit connectors.

19. A display system as in claim 17 wherein the angle between adjacent units is adjustable.

20. A display system as in claim 17 wherein said snap-fit connectors configured to connect a plurality of said units together are selected from fixed and hinged connectors.

21. A display system as in claim 19 wherein said snap-fit connectors configured to connect a plurality of said units together are selected from fixed and hinged connectors.

* * * * *